(12) United States Patent
Ginetti et al.

(10) Patent No.: US 8,732,636 B2
(45) Date of Patent: May 20, 2014

(54) METHOD, SYSTEM, AND COMPUTER PROGRAM PRODUCT FOR IMPLEMENTING MULTI-POWER DOMAIN DIGITAL / MIXED-SIGNAL VERIFICATION AND LOW POWER SIMULATION

(75) Inventors: Arnold Ginetti, Antibes (FR); Donald J. O'Riordan, Sunnyvale, CA (US); Madhur Sharma, Ghaziabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 356 days.

(21) Appl. No.: 12/752,620

(22) Filed: Apr. 1, 2010

(65) Prior Publication Data

US 2011/0161899 A1 Jun. 30, 2011

Related U.S. Application Data

(60) Provisional application No. 61/291,199, filed on Dec. 30, 2009.

(51) Int. Cl.
  *G06F 9/455* (2006.01)
  *G06F 17/50* (2006.01)

(52) U.S. Cl.
  USPC ........... 716/106; 716/101; 716/105; 716/109; 716/133

(58) Field of Classification Search
  USPC .......................... 716/101, 106, 111, 120, 125
  See application file for complete search history.

(56) References Cited

U.S. PATENT DOCUMENTS

| | | | |
|---|---|---|---|
| 5,696,694 A * | 12/1997 | Khouja et al. | 716/120 |
| 7,739,629 B2 * | 6/2010 | Wang et al. | 716/136 |
| 7,954,078 B1 * | 5/2011 | Wang et al. | 716/127 |
| 2001/0018647 A1 | 8/2001 | Weber | |
| 2005/0050495 A1 * | 3/2005 | McGuffin et al. | 716/5 |
| 2007/0245278 A1 * | 10/2007 | Chen | 716/5 |
| 2007/0245285 A1 * | 10/2007 | Wang et al. | 716/10 |
| 2008/0127015 A1 | 5/2008 | Chandramouli et al. | |
| 2010/0064271 A1 * | 3/2010 | Chen | 716/5 |

OTHER PUBLICATIONS

Non-Final Office Action dated Apr. 13, 2012 for U.S. Appl. No. 12/752,650.
Final Office Action dated Sep. 4, 2012 for U.S. Appl. No. 12/752,656.
"IEEE Standard for Design and Verification of Low Power Integrated Circuits," Mar. 27, 2009, pp. 1-234.
"Si2 Common Power Format Specification," Feb. 14, 2011, pp. 1-318.
Non-Final Office Action dated Sep. 12, 2013 for U.S. Appl. No. 12/752,656.

* cited by examiner

*Primary Examiner* — Thuan Do
*Assistant Examiner* — Brian Ngo
(74) *Attorney, Agent, or Firm* — Vista IP Law Group, LLP

(57) ABSTRACT

Disclosed are a method, system, and computer program product for implementing various embodiments of the methods for implementing multi-power domain digital or mixed-signal verification and low power simulation. The method or the system comprises automatically generating one or more net or terminal expression, set, or one or more overriding net or terminal expression by reading, importing, or interpreting the power data file for the electronic circuit design; identifying one or more schematics of the electronic circuit design; generating an annotated schematic of the electronic circuit design by automatically annotating at least one of the one or more schematics with some of the one or more net or terminal expression, set, or one or more overriding net or terminal expression; and performing verification of the electronic circuit design by using at least the annotated schematic.

26 Claims, 20 Drawing Sheets

(g)

(f)

(e)

(d)

METHOD, SYSTEM, AND COMPUTER PROGRAM PRODUCT FOR IMPLEMENTING MULTI-POWER DOMAIN DIGITAL / MIXED-SIGNAL VERIFICATION AND LOW POWER SIMULATION

CROSS-REFERENCE TO RELATED APPLICATION(S)

This Application claims the benefit of U.S. Provisional Patent Application Ser. No. 61/291,199, filed on Dec. 30, 2009, the entire disclosure of which is expressly incorporated by reference here. Certain aspects in some embodiments of this Application are related to and disclosed in U.S. application Ser. No. 12/752,656, entitled "METHOD, SYSTEM, AND COMPUTER PROGRAM PRODUCT FOR IMPLEMENTING MULTI-POWER DOMAIN DIGITAL/MIXED-SIGNAL VERIFICATION AND LOW POWER SIMULATION" and was filed concurrently. The contents of both applications are expressly incorporated by reference in their entirety in this Application.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Physical verification is very critical to the success of the chip design. One of the most important key steps to perform physical verification on the layout design is to verify that the layout matches the schematic. This is so called LVS (layout-versus-schematic), which involves checking the consistency between the original schematic netlist and the one extracted from the layout. Because of the design reuse and the implementation of the multiple power/ground domains, VDD (or $V_{DD}$, both designating the positive power supply voltage in field effect transistors or unipolar transistors) and GND (ground) are designed as global nets, but they are not globally connected throughout the chip. The standard LVS flow, which verifies VDD and GND as global nets, may no longer be functional.

LVS is one of the most important physical verification steps in integrated circuit (IC) design. It serves to check the equivalency of a layout design against the corresponding schematic design. If the two designs are equivalent under the given LVS rule deck (LVS runset), then the LVS result is said to be "LVS clean". LVS tools first generate a netlist based on extracting the connectivity of an input layout stream file. The extracted netlist is then compared to the schematic netlist to ensure the two views match.

Power nets are typically globally connected throughout the design, and so are the ground nets. VDD and GND are designed as global nets at the block level, which is done to simplify the schematic level design process; treating them as local nets would require creating specific hierarchical ports for VDD and GND within each schematic. At the full-chip level, however, under the multiple power/ground domains scenario VDD and GND can no longer be treated as global nets. LVS methodology for the block level now fails at the full-chip level. For example, a short on GND between different processor cores cannot be detected because GND is considered to be global. The design team needed an LVS methodology that enabled each block to be independently verified during the development. They also needed the LVS flow to be capable of verifying the integrity of the chip level power grid with minimum impact in altering the design.

In hierarchical LVS, layout text is viewed hierarchically. In a schematic netlist, nets listed as global are assumed to be connected throughout the design during netlist comparison. Similarly, nets defined as global in layout are treated as global during netlist extraction. Global net names are dispersed through connections up the hierarchy. Local or non-global nets only specify a net's value for a particular hierarchical level. If two or more texts are attached to one net, LVS reports this as a short. A text open is reported, if different physical nets have the same text.

Multi-power-domain LVS is the second phase of the LVS flow, which targets verifying the integrity of the chip-level power grid. Unlike the standard-LVS, in which VDD and GND are treated as global names, multi-power-domain LVS analyzes power and ground nets as local nets. A netlist parser is implemented to create a schematic netlist with localized VDD and GND nets, and also the multipower-domain power and ground names are added as ports at the appropriate level of netlist hierarchy based on the information provided in a configuration file. The actual multi-power-domain power and ground names labeled at the bumps are used in the second phase LVS. Hence, any opens or shorts on the power-grid will be reported upon completing the multi-power-domain LVS verification.

In the design of integrated circuits, saving power has become one of the primary goals, and designers are usually forced to use sophisticated techniques such as clock gating, multi-voltage logic, and turning off the power entirely to inactive blocks. Recent development in power-saving techniques have resulted in the Si2 Common Power Format (CPF) and subsequently the IEEE Unified Power Format (UPF), both of which are file formats for specifying power-saving techniques early in the design process. These techniques require a consistent implementation in the design steps of logic design, implementation, and verification.

For example, if multiple different power supplies are used, then logic synthesis must insert level shifters, place and route must deal with them correctly, and other tools such as static timing analysis (STA) and formal verification must understand these components. As power became an increasingly pressing concern, each tool independently added the features needed. Although this makes it possible to build low power flows, it was difficult and error prone since the same information needed to be specified several times, in several formats, to many different tools. CPF and UPF were created as common formats that many tools can use to specify power-specific data, so that power intent only need be entered once and can be used consistently by all tools. The aim of CPF and UPF is to support an automated, power-aware design infrastructure, and a CPF or an UPF power connection expects power and ground terminals within an instantiated components.

Another challenge in electronic design occurs when transistor level netlist of the components instantiated within a digital or mixed-signal block do not have power and ground terminals, but rather have some global signal decorated with a special property placed on a net or terminal to define its connectivity, while the power connectivity of the digital or mixed-signal block is described by, for example, a CPF or an UPF file. Such a special property may be, for example, a net expression or an oaNetConnectDef or oaTermConnectDef for OpenAccess (OA) by the OpenAccess Coalition (hereinafter a net/terminal expression or a net or terminal expression). The challenge arises when generating transistor netlist from the digital or mixed-signal block when trying to connect power and ground nets of the components transistor level netlists to the CPF or UPF based power and ground nets which have multiple power domains.

For example, the traditional approach outputs reference cell schematics with global power and ground nets (such as using a CDL (circuit description language)—out function in some EDA (electronic design automation) tools. This traditional approach then outputs the logical HDL model (such as a Verilog model), and then feeds the layout-versus-schematic (LVS) tool with the digital or mixed-signal block CDL netlist and layout. The issues with this traditional approach is that this traditional approach does not work if two instances of the same reference cell are to be connected to two different domains because these two instances would share the same CDL netlist with the same global power and ground nets.

Various approaches have been proposed to solve the aforementioned challenges. One of the approaches uses scripts to automatically add power and ground terminals to the reference cell schematics and then uses the RTL compiler or an RTL to GDSII tool to dump the physical HDL model (such as a Verilog model). This approach then uses, for example, a schematic editor to import the physical Verilog model and performs CDL-out. The drawbacks of this approach is that the reference cell schematics are often considered as golden and do not allow changes. Moreover, the addition of power and ground terminals to each reference cell schematic is cumbersome, especially for analog IP (intellectual property) schematics.

Another approach uses the RTL compiler or the RTL to GDSII tool to dump the physical Verilog model, and then uses scripts to translate the physical Verilog model into a Verilog (for example, a netSet-based or oaAssignment-based Verilog) based on one or more lookup properties or one or more overriding properties of one or more special properties that are placed on a net or terminal to define its connectivity. Hereinafter, the one or more lookup properties or one or more overriding properties of one or more special properties that are placed on one or more instances to define their connectivity (such as a netSet or an oaAssignment in OpenAccess by the OpenAccess Coalition) are collectively referred to as a net/terminal set for simplicity in this application, and the one or more special properties that are placed on a net or a terminal to define its connectivity (such as a netExpression, a terminalExpression, or an oaNetConnectDef or oaTermConnectDef for OpenAccess) are collectively referred to as a net/terminal expression or a net or terminal expression. Finally, the approach uses the schematic editor or other similar EDA tools to perform CDL-OUT.

Another approach performs CDL-OUT for all reference cell schematics with automatically drilled or placed power and ground terminals or pins and then uses, for example, a schematic editor to dump the physical Verilog. This approach finally translates the physical Verilog with another tool such as a Verilog2CDL. A similar approach uses scripts to post process the CDL to add power and ground terminals. All these approaches require manual addition of the power and ground terminals, modification of the reference cell schematics which are often golden and thus do not allow modification, do not consider the CPF or UPF files for specifying power-saving techniques in the early stages of the design.

SUMMARY

What is needed is a method, a system, and a computer program product for implementing multi-power domain digital or mixed-signal verification and low power simulation. In various embodiments, the method or the system for implementing multi-power domain digital or mixed-signal verification and low power simulation comprises identifying a power data file such as a CPF file or a UPF file that specifies power specific data for a hierarchical electronic circuit design with multiple power domains.

The method or the system further comprises identifying a hardware description language model of the hierarchical electronic circuit design, reading, importing, or interpreting the power data file, and identifying schematics of various hierarchies of the hierarchical electronic circuit design. The method or the system then automatically generates the net/terminal expressions and net/terminal sets from the power data file and automatically annotates the various schematics with which multiple power domains are associated. The method or the system may then perform low power simulation by using the annotated schematics. The method or the system then further identifies a layout of the hierarchical electronic circuit design and performs verification such as the layout-versus-schematic check.

BRIEF DESCRIPTION OF THE DRAWINGS

The drawings illustrate the design and utility of preferred embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAIL DESCRIPTION

Various embodiments of the invention are directed to a method, system, and computer program product for implementing multi-power domain digital/mixed signal verification and low power simulation in the single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, the present invention encompasses present and future known equivalents to the components referred to herein by way of illustration.

Figure 1:
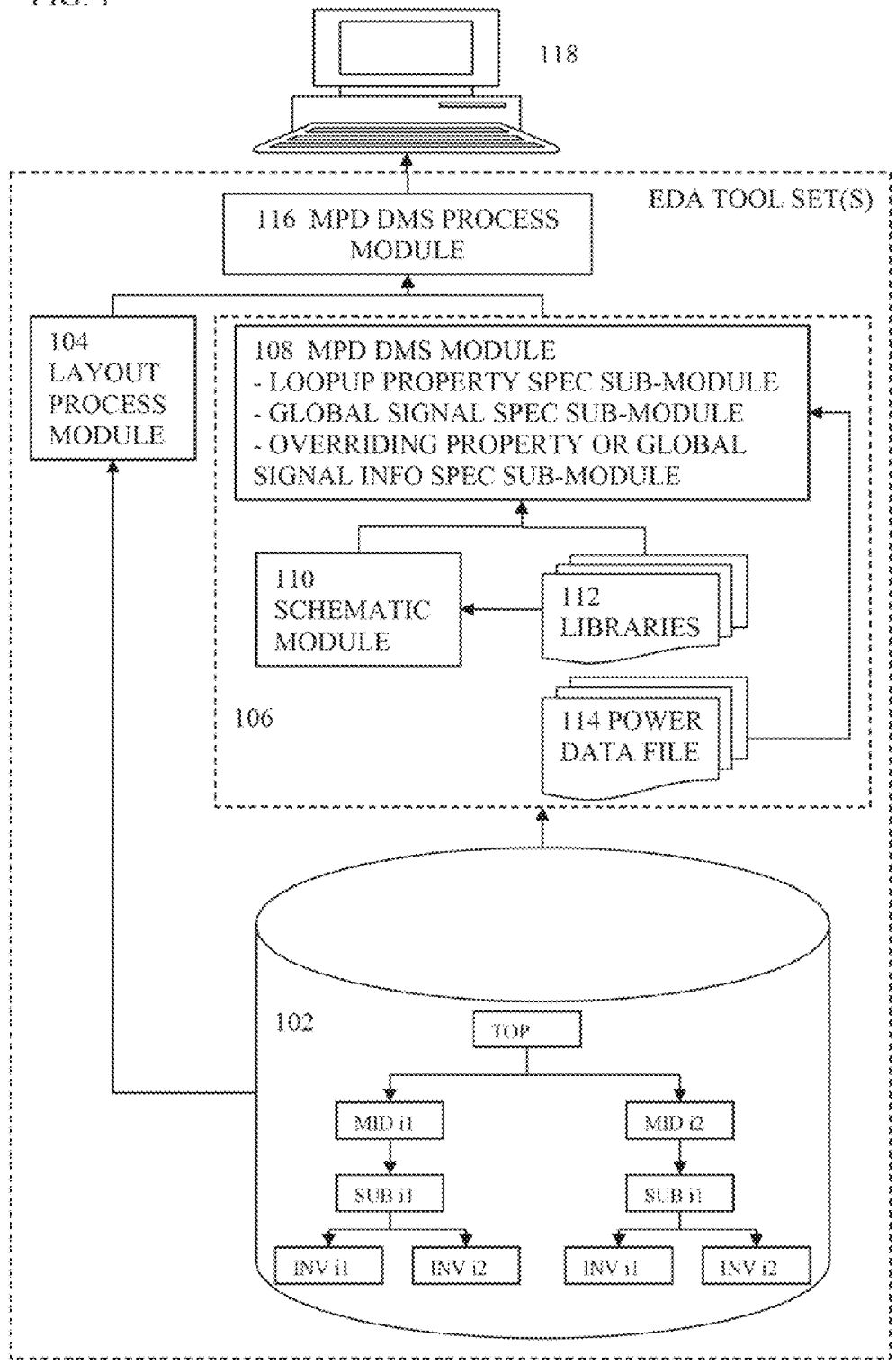
FIG. 1 illustrates a special purpose system for implementing various embodiments of the methods for implementing multi-power domain digital or mixed-signal verification and low power simulation.

With reference to FIG. 1 which illustrates a special purpose system 108 for implementing various embodiments of the methods for implementing multi-power domain digital or mixed-signal verification and low power simulation, the special purpose system comprises at least one processor which is specifically programmed to perform various processes in various methods as described below. The special purpose system may further comprise a computer readable storage medium or a computer storage device for storing various data and information either temporarily or permanently prior to, during, or after the performance of various processes as described with reference to various methods below.

More specifically, the special purpose system comprises or is operatively coupled to a storage device or a computer readable storage medium 102 which stores thereupon the hierarchical electronic circuit design in various formats. In some embodiments, the storage device or the computer readable storage medium 102 may be located remotely on, for example, another computing node such as a server. The hierarchical electronic design in the storage device or the computer readable storage medium 102 represents a simplified, hierarchical design with four hierarchical levels where the top hierarchical, TOP module is at the top level of the hierarchy and comprises two instances of the MID modules, MIDi1, and MID i2.

The MID i1 instance of the MID module comprises an instance of the SUB module, SUB i1, which further comprises two instances of the same inverter, INV i1 and INV i2. The two instances of the inverter component or module, INV i1 and IVN i2, of the SUB i1 instance may be identical or different and may belong to different power domains and thus subject to different power (for example, voltages.) Similarly, the instance MID i2 also comprises an instance of the SUB module, SUB i1, which also comprises two instances of the inverter component or module, INV i1 and INV i2. The two instances of the inverter component or module, INV i1 and IVN i2, of the SUB i2 instance may be identical or different and may belong to different power domains and thus subject to different power (for example, voltages.) Note that this hierarchical design is merely exemplary and does not intend to limit the scope of various embodiments by any means.

The special purpose system may also comprise a layout process module 104 which generates or identifies the layout for the hierarchical electronic circuit design 102. The layout process module may also comprise a design rule checking (DRC) module, a layout versus schematic (LVS) module, or a compiler which compiles, for example, an RTL model into, for example, a GDSII format. The layout process module 104 may also comprise a layout extraction tool that is used generate actual circuit netlist from the layout. The extracted view may be used to run Layout Versus Schematic (LVS) or to run simulation.

The special purpose system further comprises schematic process module 106 which is operatively coupled to the libraries 112 and the power data file(s) 114. The libraries and the power data file(s) may be located on the same computing node as the schematic process module 106 or may be located on one or more different computing nodes. The libraries 112 may comprise, for example, standard cell reference libraries, basic libraries, design libraries, basic libraries, etc. A power data file may comprise a file in the Common Power Format (CPF), the Unified Power Format (UPF), or other similar formats.

The schematic process module 106 may also comprise the schematic module 110 which identifies, determines, or generates the schematic for the electronic circuit design of interest. The schematic module 110 may also be operatively coupled to the libraries 112 to identify various schematics for various portions or components in the electronic circuit design of interest. The schematic process module further comprises the multi-power domain digital or mixed-signal block module 108 which receives the schematics from the schematic process module 110. The multi-power domain digital or mixed-signal block module 108 may also receive needed libraries from the libraries 112.

The multi-power domain digital or mixed-signal block module 108 further reads, imports, or interprets the power data file, such as a common power format (CPF) file or a unified power format (UPF) file which specifies specific power data for the hierarchical electronic circuit design.

According to some embodiments, the power data file specifies a common format that many EDA tools (such as the logic synthesis tools, place and route tools, static timing analysis, formal verification, etc.) may use to specify power-specific data consistently because the power intent only need be specified once in the power data file.

The power data file may comprise, for example, constructs for expressing power domains and their respective power supplies in some embodiments. The constructs comprise hierarchical modules that may be specified as belonging to specific power supply domains in some embodiments. The constructs may also comprise explicit power or ground nets and connectivity for each cell or block in some embodiments. In addition the constructs may also comprise various timing libraries data which may be especially useful for cases where a cell is used in different power domains.

In addition or in the alternative, the power data file may comprise power control logic for specifying switch logic and control signals, state-retention logic, level shifter logic, or isolation logic in some embodiments. The power data file may also comprise definitions or verification of power modes such as standby, sleep, etc. In addition, the power data file supports both the bottom-up and the top-down design and provide portability of design intent across various ED tools including third-party EDA tools.

In some embodiments, the schematic module 110 performs all the functions of the multi-power domain digital or mixed-signal process module 116 (MPD DMS Process Module). In some embodiments, the multi-power domain digital or mixed-signal block module 108 (MPD DMS Module) performs all the functions of the schematic module 110. In other words, module 110 and 108 may be the same in some embodiments. The multi-power domain digital or mixed-signal block module 108 automatically generates the net/terminal sets, from the action of reading, importing, or interpreting (hereinafter referencing) the power data file 114, that are needed to annotate the schematic(s) of the hierarchical electronic design which exhibit multiple power domains even for a plurality of instances of the same master module. In these embodiments, the reference schematics or the leaf schematics are assumed to comprise at least the requisite net or terminal expressions.

For example, the method or the system may obtain the hierarchical logical modules or constructs, which are specified in the power data file as belonging to specific power domains, power or ground nets and connectivity per cell or per block, level shifter logic, isolation logic, etc. from the act of reading, importing, or interpreting the power data file that are needed to annotate the schematic(s) of the hierarchical electronic design in some embodiments. In this manner, the schematic of the hierarchical electronic circuit design is associated with connectivity information for each level of a plurality of hierarchies and may be used in an automated layout versus schematic verification.

The multi-power domain digital or mixed-signal block module 108 may comprise a lookup property specification sub-module which is used to specify the net/terminal sets. The multi-power domain digital or mixed-signal block module 108 may also comprise a global signal specification sub-module which is used to specify the net/terminal expressions. The multi-power domain digital or mixed-signal block module 108 may further comprise the overriding property or global signal information specification sub-module which specifies an overriding net/terminal expression or a net/terminal expression that may be used to override one or more default values of the global signals.

The modules 102, 104, 106, 108, 110, 112, 114, and 116 are located on one or more EDA (electronic design automation) tool sets. The multi-power domain digital or mixed-signal block module 108 then automatically annotates various schematics of the hierarchical electronic design to provide the complete connectivity information with the default or the overriding net/terminal sets such that the annotated hierarchical electronic circuit design schematics together with the layout from the layout process module 104 may be used for LVS (layout-versus-schematic). In these embodiments, one or more of the aforementioned actions create the net or terminal sets on various instances of the schematics, which comprise at least the corresponding net or terminal expressions.

In various embodiments, a default net or terminal set specifies the net that is to be used instead of the default net specified in the net or terminal expression. Furthermore, an overriding net or terminal set redefines a leaf cell net or terminal expression. In other words, an overriding net or terminal set redefines the default name of the net and the property name(s) in the associated net or terminal expression in these embodiments. The multi-power domain digital or mixed-signal block module 108 may also automatically annotate various schematics of the hierarchical electronic design to provide the complete connectivity information such that the annotated schematics may be used for low power simulation. In various embodiments, the special purpose system comprises at least some hardware components such as a specially programmed processor to perform specific functions or processes although some sub-modules as described above may be implemented as a pure software module, a pure hardware module, or a combination of software and hardware.

Figure 9:
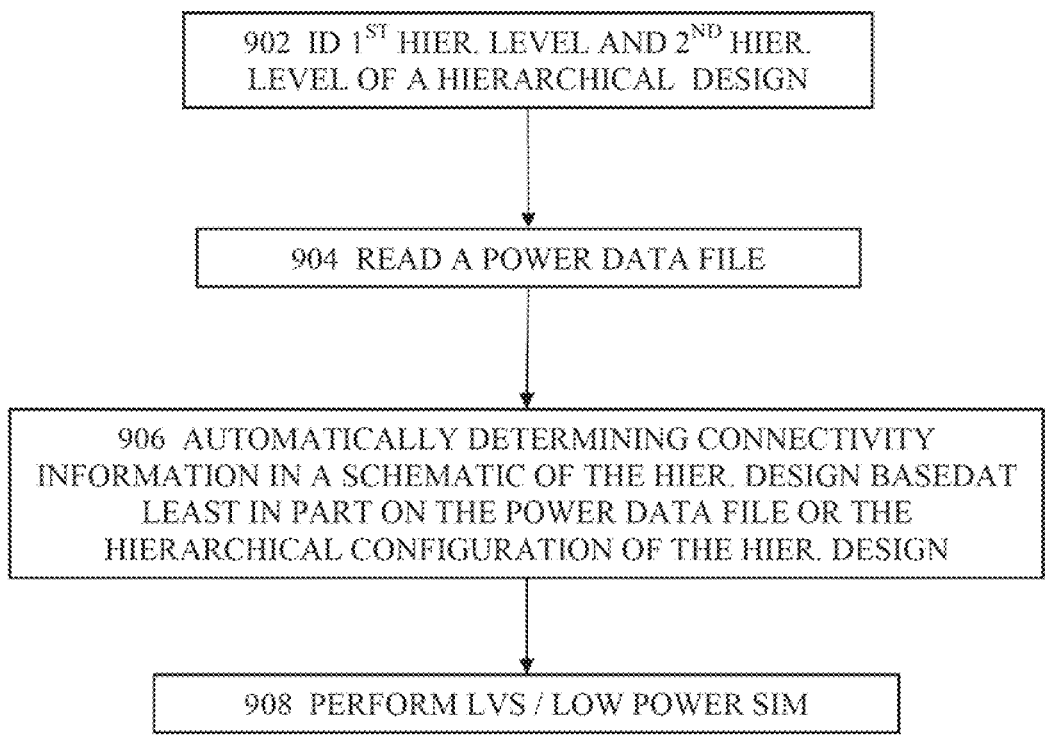
FIG. 9 illustrates a high level diagram for a process for implementing multi-power domain digital or mixed-signal verification and low power simulation.

With reference to FIG. 9 which illustrates a high level diagram for a process for implementing multi-power domain digital or mixed-signal verification and low power simulation, the method or the system comprises the act or module of identifying a first hierarchical level and a second hierarchical level of a hierarchical electronic circuit design at 902 in some embodiments. In these embodiments, each of the first hierarchical and the second hierarchical level comprises at least a circuit component that is belongs to multiple power domains or is subject to multiple input voltages.

The method or the system for implementing multi-power domain digital or mixed-signal verification and low power simulation further comprises the act or module of reading a power data file at 904 in some embodiments. More details of the power data file will be described in subsequent paragraphs with reference to various figures. The method or the system may further comprise the act or module of automatically determining or inserting connectivity information in a schematic of the hierarchical electronic design at 906 in some embodiments. According to some embodiments, the act or module of 906 is based at least in part upon the power data file. According to some embodiments, the act or module of 906 is further based at least in part upon the hierarchical configuration of the hierarchical design.

The hierarchical configuration comprises information such as which hierarchical level represents the component that is subject to multiple input voltages in some embodiments. The hierarchical information may alternatively or additionally comprise information such as the number of levels between the level that represents the component subject to multiple input voltages and the first level or the second level. Note that in some embodiments, one of the first and the second level may be the level that represents the component subject to multiple input voltages.

Figure 2:
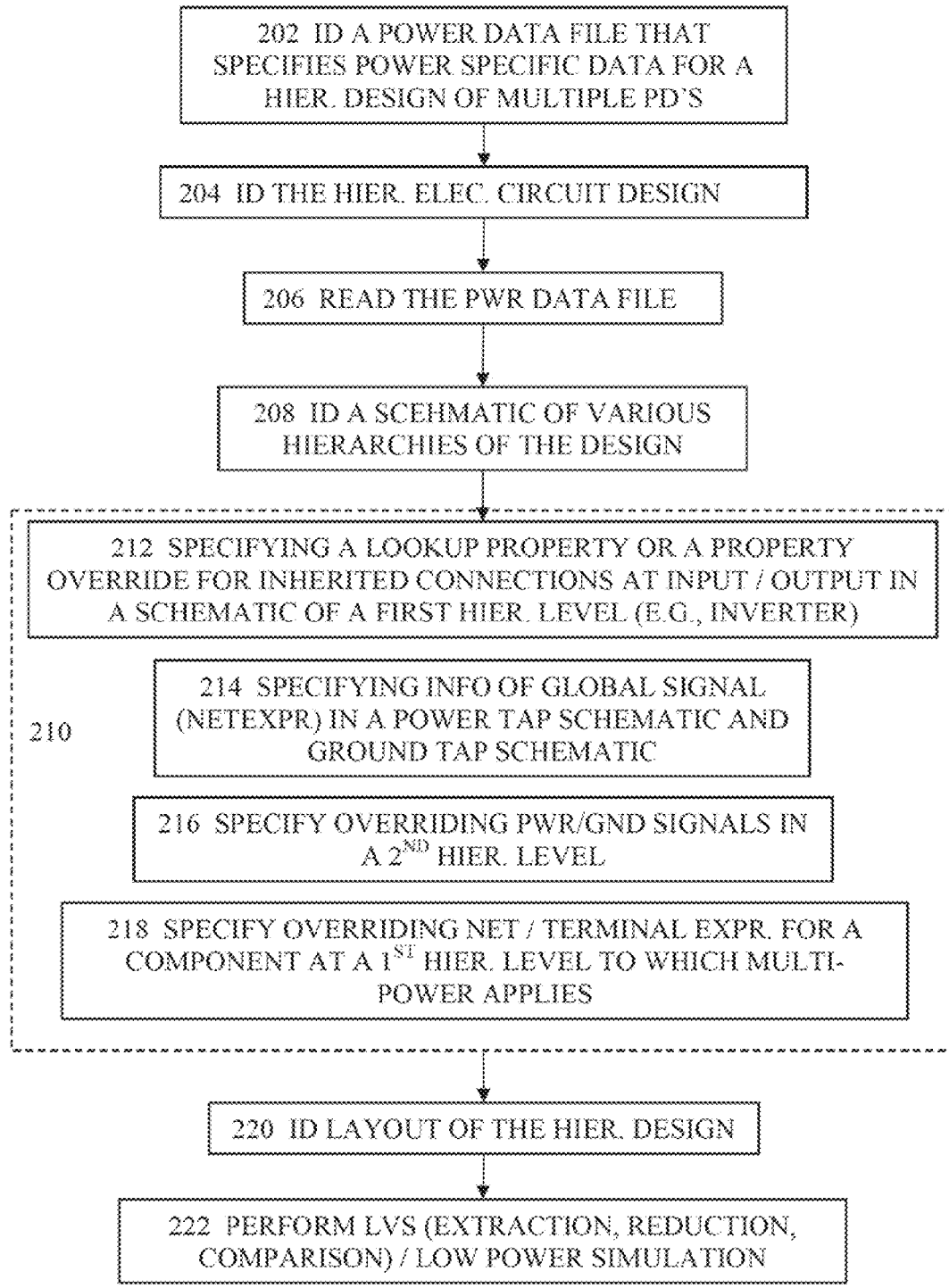
FIG. 2 illustrates a more detailed diagram for a process for implementing multi-power domain digital or mixed-signal verification and low power simulation as illustrated in FIG. 9.

With reference to FIG. 2 which illustrates a more detailed diagram for a process for implementing multi-power domain digital or mixed-signal verification and low power simulation as illustrated in FIG. 9, the method or the system comprises identifying a power data file at 202 in a single embodiment or in some embodiments. In the single embodiment or in some embodiments, the power data file comprises a CPF file, an UPF file, or files in other formats serving similar purposes. The method or the system further comprises identifying a hierarchical electronic circuit design, such as an HDL description of an electronic circuit design at 204. In the single embodiment or in some embodiments, the hierarchical electronic circuit design comprises multiple power domains even for different instances of the same module. For example, the hierarchical electronic circuit design may comprise multiple instances of the same inverter that are subject to different operating voltages.

The method or the system further comprises reading, importing, or interpreting the power data file at 206. In the single embodiment or in some embodiments, the action or the module for reading, importing, or interpreting the power data file 206 may comprise creating one or more nets and a plurality of power domains and associate each of the one or more nets and a plurality of power domains with the respective instances, ports, or pins. The action or the module 206 may further comprise specifying detailed implementation of the plurality of power domains. More details of specifying the detailed implementation of the plurality of power domains will be described in great details in the illustrative embodiments in the following paragraphs. The action or the module 206 may also comprise specifying how to connect a global net to specified pins, ports, or terminals.

In the single embodiment or in some embodiments, the method or the system for implementing multi-power domain digital or mixed-signal verification and low power simulation further comprises identifying one or more schematics of various hierarchies of the hierarchical electronic circuit design at 208. At 210, the method or the system for implementing multi-power domain digital or mixed-signal verification and low power simulation comprises automatically annotating the one or more schematics of the hierarchical electronic circuit design with complete connectivity information in the single embodiment or in some embodiments.

The action or the module 210 may comprise specifying a look up property or an overriding net/terminal expression for inherited connections (net/terminal expression) at one or more inputs and outputs in a schematic of a first hierarchical level at 212. The action or module 210 may also comprise specifying one or more special properties that are placed on one or more instances of a schematic to define their connectivity by creating the default or overriding net or terminal sets to specify or redefine the property name(s) and the default net as specified in the net or terminal expressions at 214. In other words, the action or module 210 specifies or creates one or more default net or terminal sets or one or more overriding net or terminal sets on some instances of the schematics based at least in part on the existing net or terminal expression(s) and the power data file. In these embodiments, the method or the system ensures that the connectivity information that is derived or inferred from the net or terminal expressions or net or terminal sets is identical or equivalent to the connectivity information derived or inferred from the power data file such as a common power format file or a unified power format file. Furthermore, once the requisite net or terminal sets or the overriding ones are generated, the method or the system may dump netlists such as CDL (Circuit Description Language) netlists such that the generated connectivity information from the net or terminal sets and the existing net or terminal expressions correctly represent the connectivity information that may be inferred or derived from the power data file.

Figure 5A:
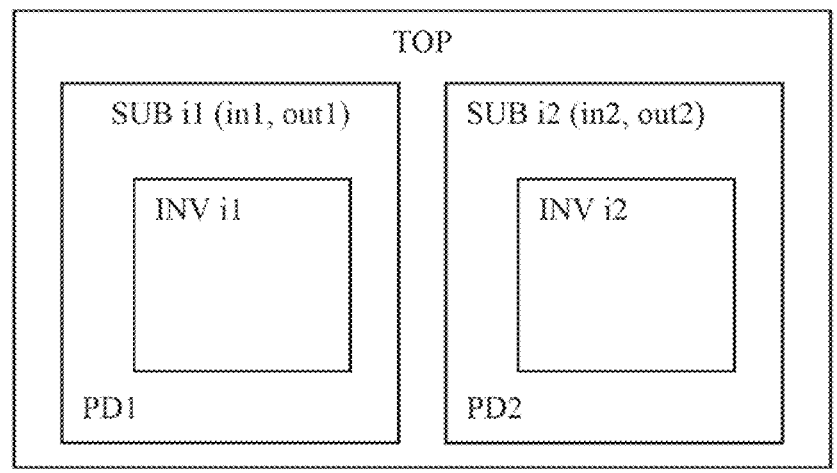
FIG. 5A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments.
Figure 5B:
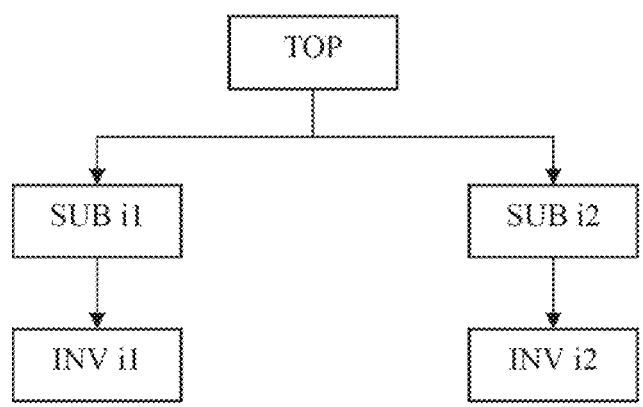
Figure 5C:
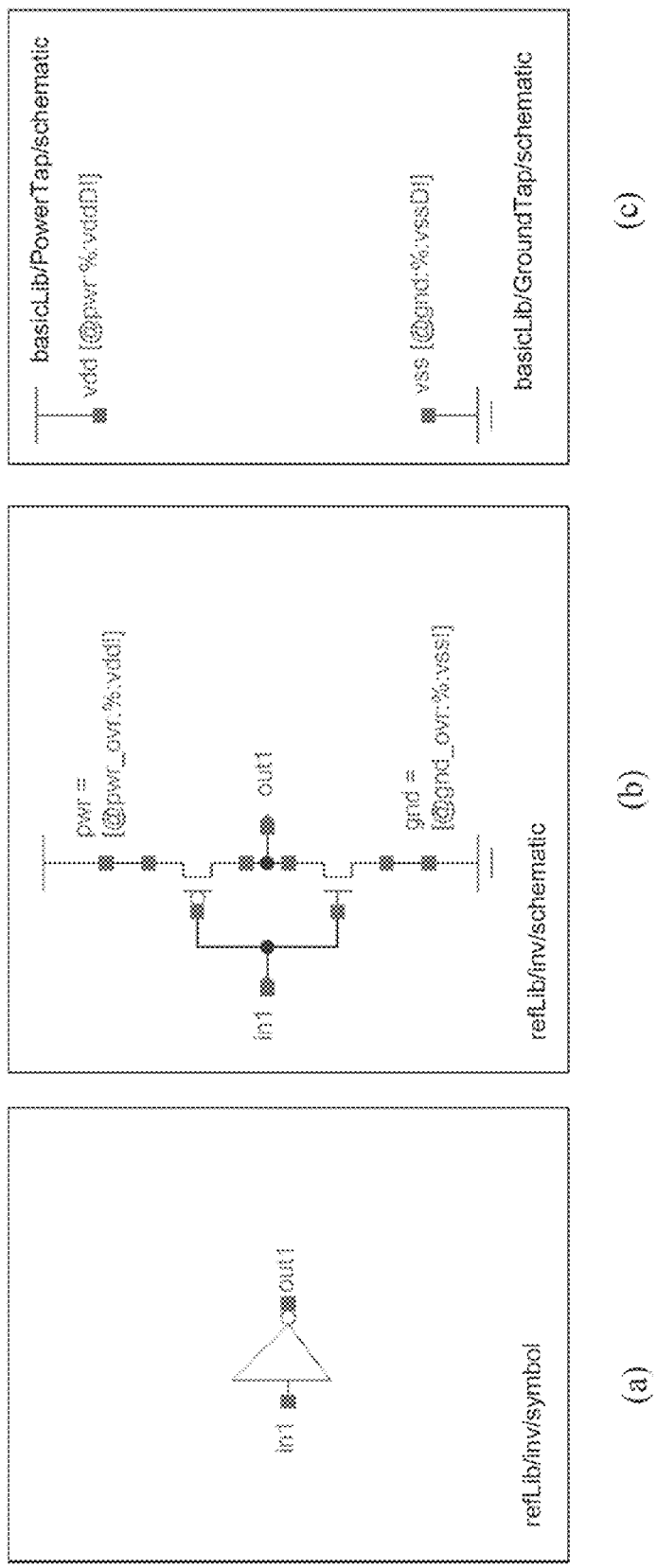
Figure 5C:
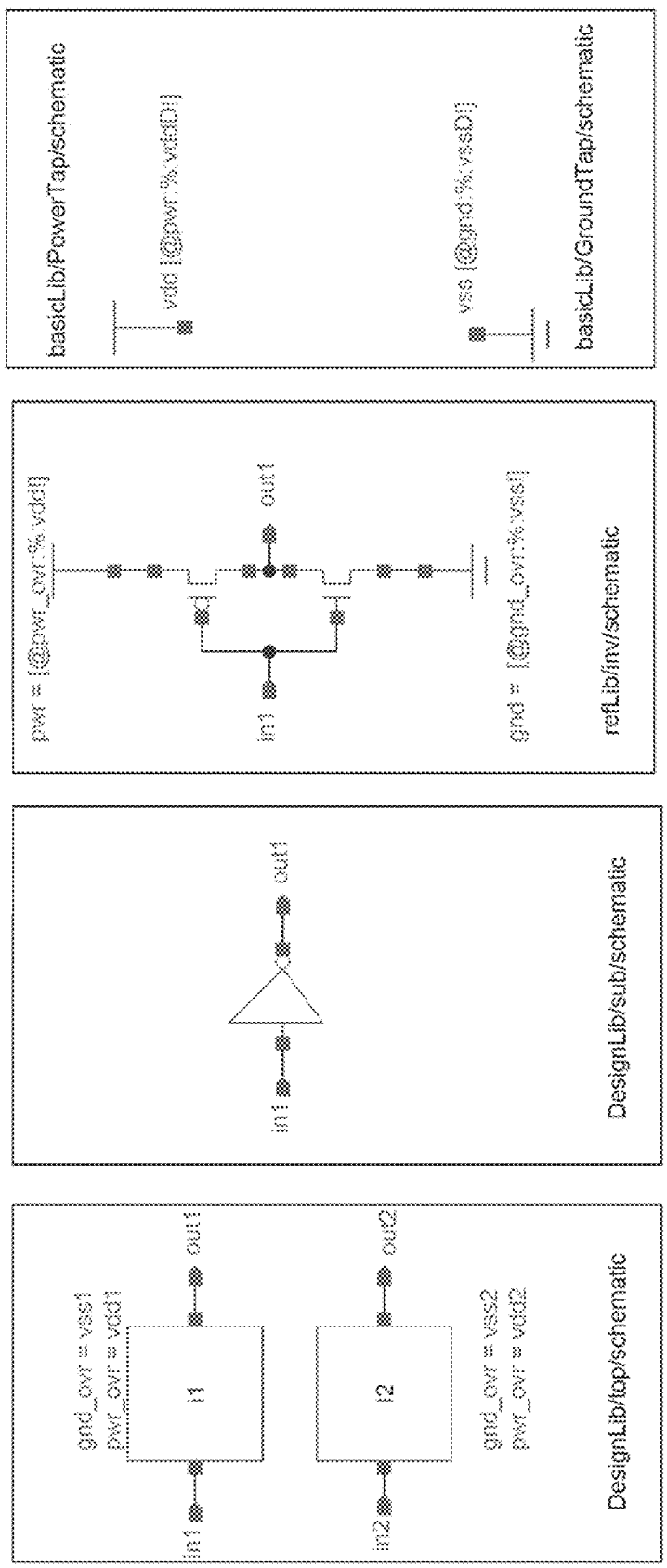

The action or the module 210 may also comprise specifying one or more overriding power or ground signals in a second hierarchical level at 216. In some embodiments, the second hierarchical level is lower than the first hierarchical level. As shown in the example as illustrated in FIGS. 5A-C, the first hierarchical level may comprise the schematic of the "TOP" module which comprises two SUB modules, each of which comprises an inverter which belongs to the second level of hierarchy in the hierarchical electronic circuit design. At 218, the action or module 210 may also comprise specifying one or more overriding net/terminal expression for a component at a the component hierarchical level wherein different instances of the component are subject to different power requirements (such as voltages) in the hierarchical electronic circuit design.

At 220, the method or the system for implementing multi-power domain digital or mixed-signal verification and low power simulation comprises identifying a layout of the hierarchical electronic circuit design. At 222, the method or the system for implementing multi-power domain digital or mixed-signal verification and low power simulation comprises performing LVS by performing, for example, extraction, reduction, and comparison between the layout and the automatically annotated schematics. The details of LVS are known to one of ordinary skill in the art and thus will not be elaborated here.

In the single embodiment or in some embodiments, one or more of the one or more actions or modules, 212, 214, 216, and 218, need not be performed. Whether or not a net/terminal set or an overriding net/terminal expression needs to be specified or created for which instance(s) at which level of the hierarchy depends at least in part on what the hierarchical structure of the electronic circuit design comprises, how the hierarchical structure of the electronic circuit design is organized, or whether not a reference cell library is allowed to be modified or annotated by the expressions or sets that are automatically generated by referencing the power data file. More details of this aspect of various embodiments are described in great details in the illustrative examples in the immediately following paragraphs.

Figure 10:
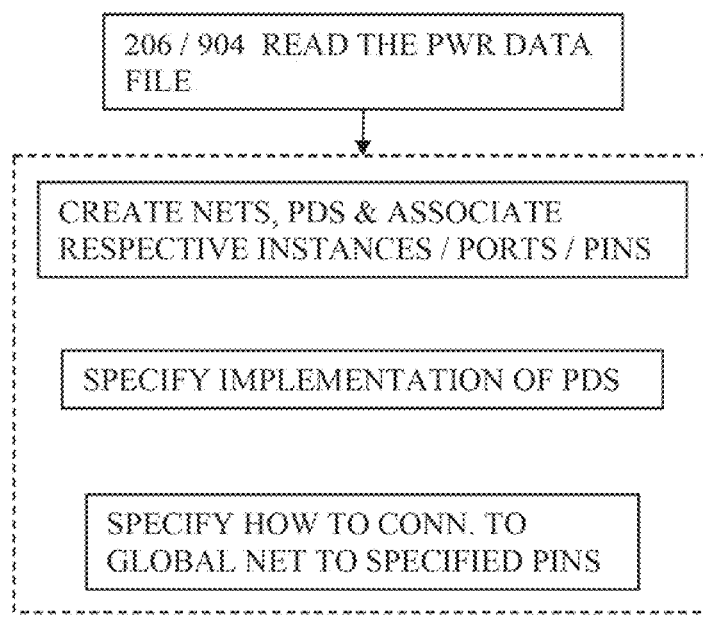
FIG. 10 illustrates more details for the process or module of reading, importing, or interpreting a power data file of FIGS. 2 and 9.

With reference to FIG. 10 which illustrates more details about the act or module of reading a power data file of 904 in FIG. 9 or 206 in FIG. 2, the action or the module for reading, importing, or interpreting the power data file 206 or 904 may comprise the act or module of creating one or more nets and a plurality of power domains and associate each the one or more nets and a plurality of power domains with the respective instances, ports, or pins in the single embodiment or in some embodiments. The action or the module 206 or 904 may further comprise the act or module of specifying detailed implementation of the plurality of power domains. More details of specifying the detailed implementation of the plurality of power domains will be described in great details in the illustrative embodiments in the following paragraphs. The action or the module 206 or 904 may also comprise the act or module of specifying how to connect a global net to specified pins, ports, or terminals.

Illustrative Examples

Figure 3A:
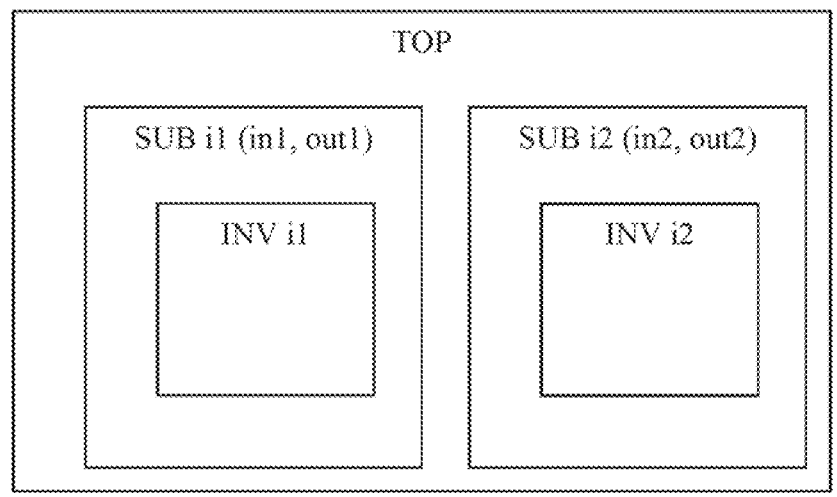
FIG. 3A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in one exemplary implementation of some embodiments.
Figure 3B:
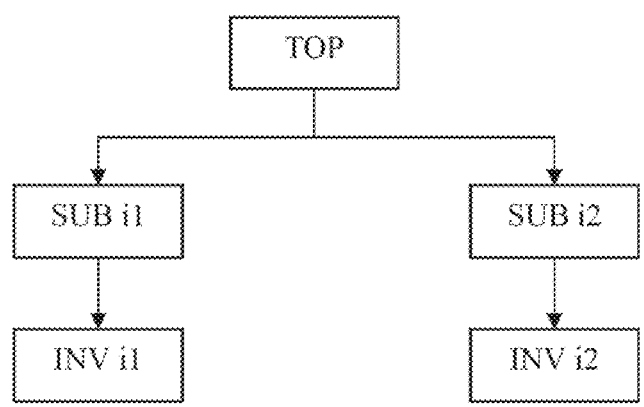
Figure 3C:
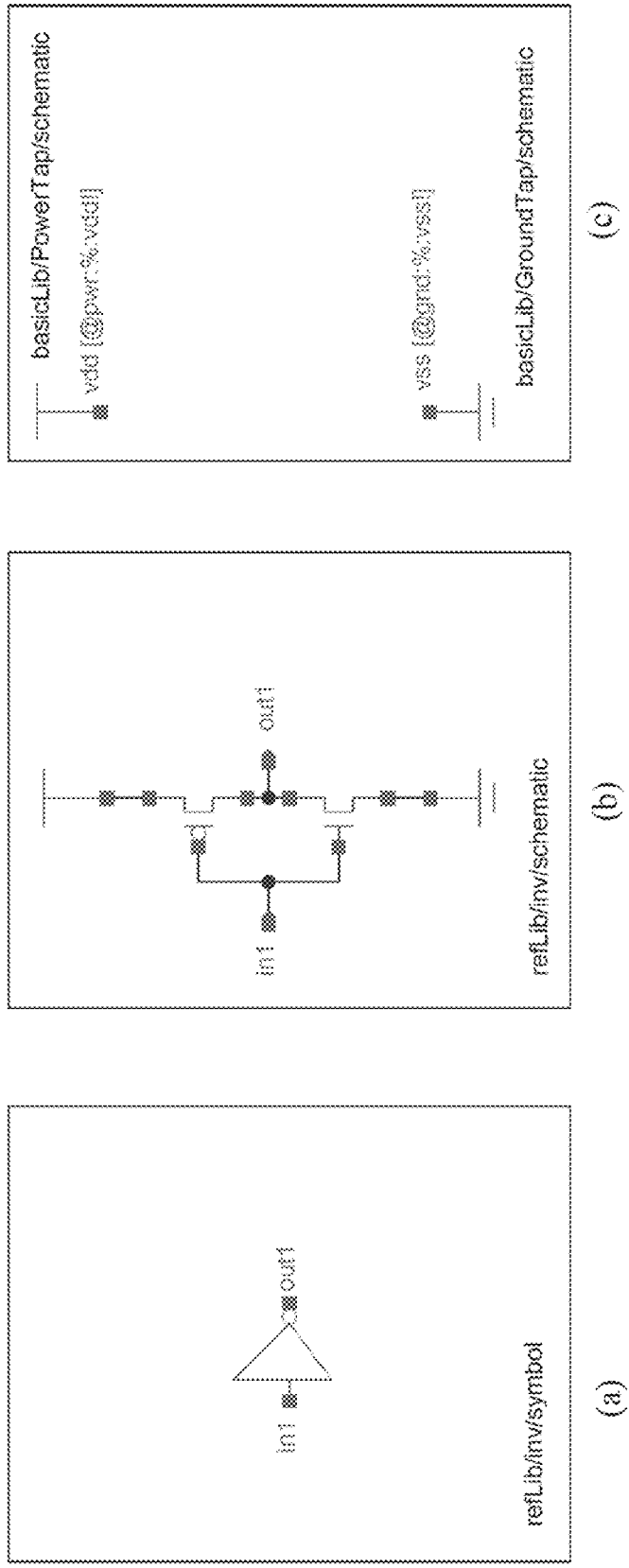
Figure 3C:
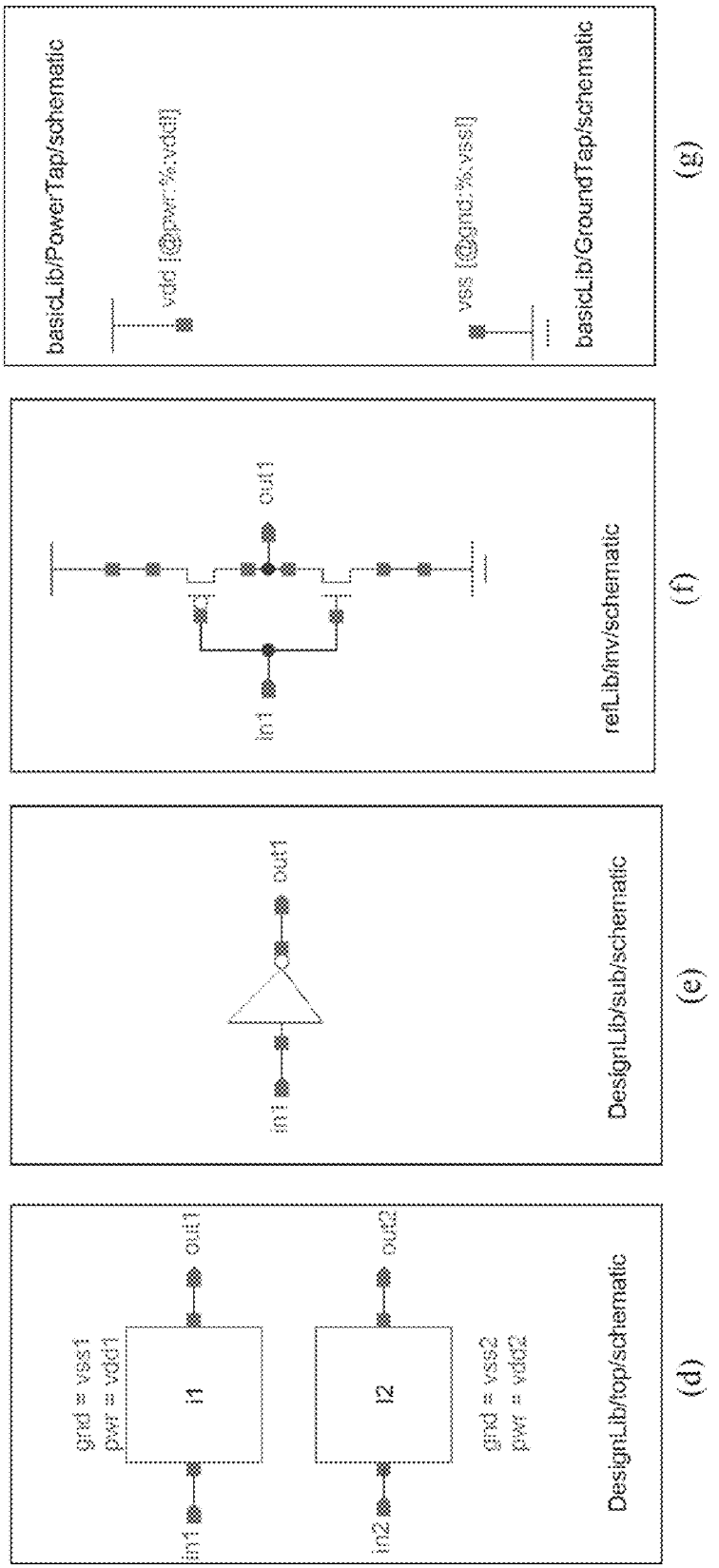

FIGS. 3A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in one exemplary implementation of some embodiments. FIG. 3A illustrates a simplified view of a TOP cell or module in a hierarchical electronic circuit design. The TOP cell or module comprise two instances of the SUB cell or module, SUB and SUB i2. SUB i1 takes input from in1 and outputs to out1, and SUB i2 takes input from in2 and outputs to out2. Each of SUB i1 and SUB i2 comprises an instance of an inverter—INV i1 for SUB i1 and INV i2 for SUB i2. FIG. 3B illustrates a simplified hierarchical representation of the TOP cell or module.

FIG. 3C illustrates an example of the method or the system for implementing multi-power domain digital or mixed-signal verification and low power simulation in some embodiments. In this example, the TOP cell is assumed to be a digital block. Nonetheless, the process disclosed herein also applies to mixed-signal or analog blocks. Furthermore, the examples uses specific languages and codes, but one of ordinary skill in the art clearly knows that other languages or codes may also be used to achieve similar purpose so the languages or codes are not to be considered as limiting the scope of various embodiments or the claims.

The Verilog description for the digital block may be expressed as follows:

```
module sub ( in1, out1);
input in1;
output out1;
INV i1(in1, out1);
endmodule
module top ( in1, in2, out1, out2);
sub I1 (in1, out1);
sub i2 (in2, out2)
endmodule
```

The power data file may be expressed as follows. Note that a Common Power Format file is used in this example, but one of ordinary skill in the art clearly knows that other formats of files, such as an UPF file, may also be used to achieve similar purposes.

```
set_design top
create_power_nets -nets { VDD1 VDD2}
create_ground_nets -nets {VSS1 VSS2}
create_power_domain -name PD1 -default -instances i1
create_power_domain -name PD2 -instances i2
update_power_domain -name PD1 -primary_power_net VDD1 -
    primary_ground_net VSS1
update_power_domain -name PD2 -primary_power_net VDD2 -
    primary_ground_net VSS2
create_global_connection -domain PD1 -net VSS1 -pin VSS!
create_global_connection -domain PD1 -net VDD1 -pin VDD!
create_global_connection -domain PD2 -net VSS2 -pin VSS!
create_global_connection -domain PD2 -net VDD2 -pin VDD!
end_design
```

In the above CPF file, "set_design" specifies the name of the module to which the power information in the CPF file applies—the TOP cell in this example. "create_power_nets" specifies or creates a list of power nets within the current scope. "create_power_domain" creates a power domain and specifies the instances and boundary ports and pins that belong to this power domain. In this example, two power domains, PD1 and PD2, are created for instances i1 and i2 respectively. "update_power_domain" specifies implementation aspects of the specified power domain.

"create_global_connection" specifies how to connect a global net to the specified pins. A global net can be a data net, bias net, power net or ground net. In this example, the VSS1 net is connected to pin/terminal VSS! In power domain PD1, VDD1 net is connected to pin/terminal VDD! in power domain PD1, VSS2 net is connected to pin/terminal VSS! in power domain PD1, and VDD2 net is connected to pin/terminal VDD! in power domain PD2. Finally, "end_design" is used with a set_design command, groups a number of CPF commands that apply to the current design or top design. It shall be noted that the naming of the nets is not case sensitive in some embodiments. In other words, VDD1 and vdd1 may both be used to refer to the same net in these embodiments.

FIG. 3C(a) illustrates the symbol of an inverter. In this case, the inverter symbol is stored as a reference library for the inverter. FIG. 3C(b) illustrates a schematic of the inverter which is stored as a reference library for the inverter. Note that the method or the system does not define or redefine the net/terminal set (in this example a netSet for the inverter) in FIG. 3C(b). FIG. 3C(c) illustrates the annotations of net/terminal expression (in this case a net expression—netExpr) in the power and ground tap of the schematic. The netExpr, vdd [@pwr:%:vdd!], specifies that the power is defaulted to vdd!, and the netExpr, vss [@gnd:%:vss!], specifies that the ground is defaulted to vss!.

FIG. 3C(d) illustrates the process that the method or the system annotates the top cell with the overriding signal names where, for instance i1, the power no longer defaults to vdd! but to vdd1, and the ground no longer defaults to vss! but to vss1, and for instance i2, the power no longer defaults to vdd! but to vdd2, and the ground no longer defaults to vss! but to vss2. FIG. 3C(e) illustrates the schematic of the SUB cell or module in the block. It can be seen that the SUB cell or module receives no modification or annotation.

FIG. 3C(f) illustrates the schematic of the inverter in the reference library, which is usually considered golden and thus does not allow modification.) It can be seen from FIG. 3C(f) that the inverter schematic is not modified or annotated. FIG. 3C(g) illustrates that the method or the system identifies the netExpr, vdd [@pwr:%:vdd!] and vss [@gnd:%:vss!] from the power and ground tap of the schematics. It shall be noted that the power no longer defaults to vdd! but to vdd1 and vdd2 due to the overriding net or terminal sets, "pwr=vdd1" and "pwr=vdd2", and that the ground no longer defaults to vss! but to vss1 and vss2 due to the overriding "gnd=vdd1" for i1 and "gnd=vss2" for i2. In this example, the two instances of the same inverter may belong to different power domain and may be subject to different power requirements.

Figure 4A:
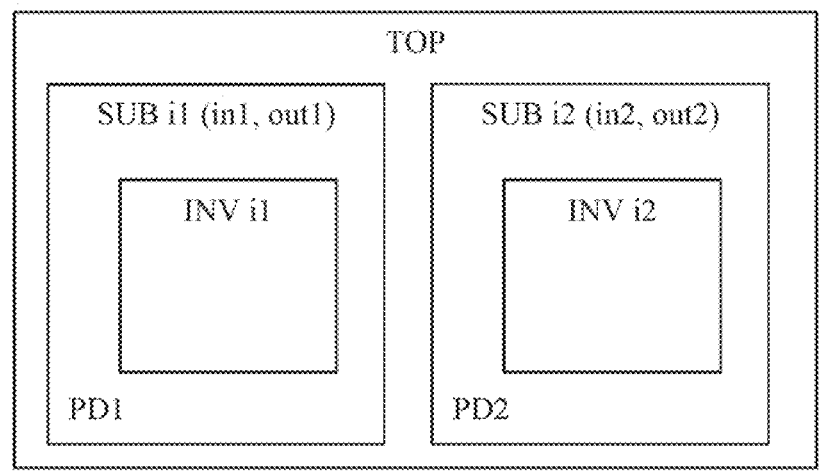
FIG. 4A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments.
Figure 4B:
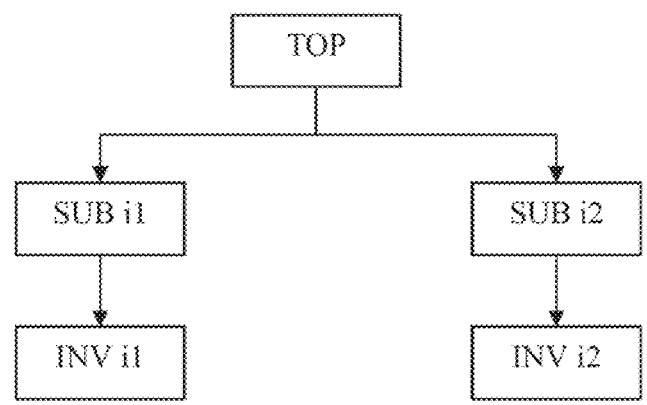
Figure 4C:
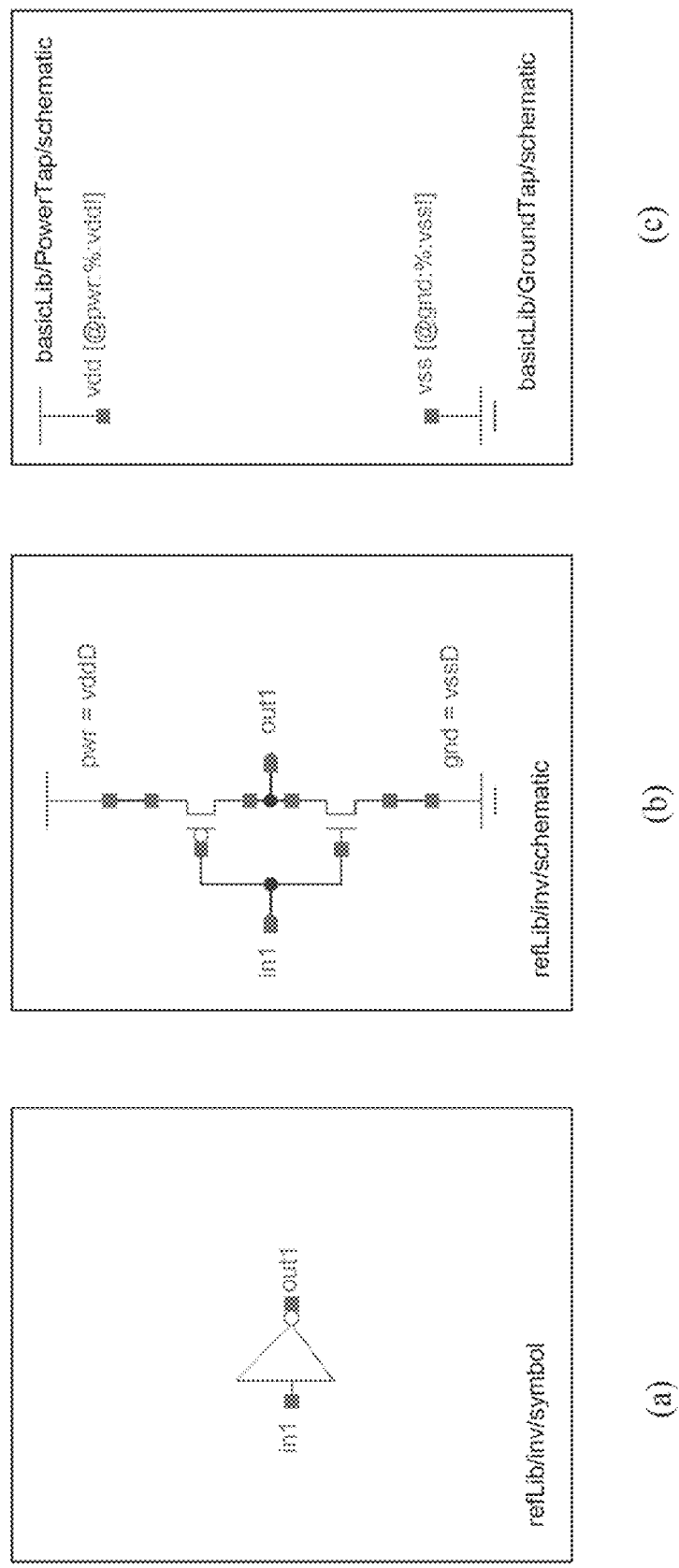
Figure 4C:
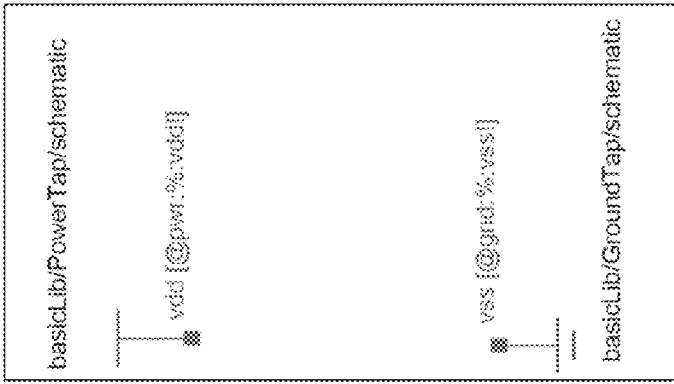
Figure 4C:
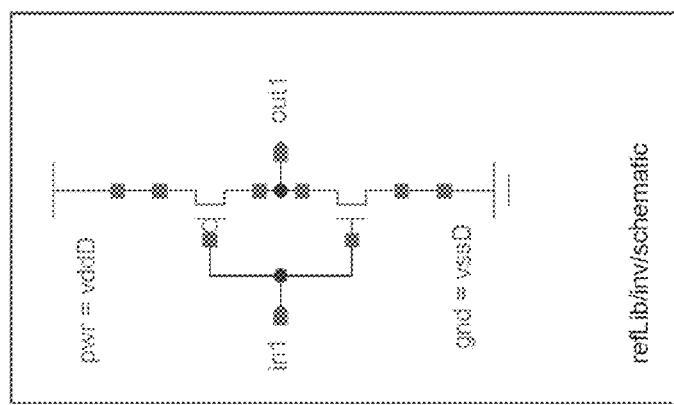
Figure 4C:
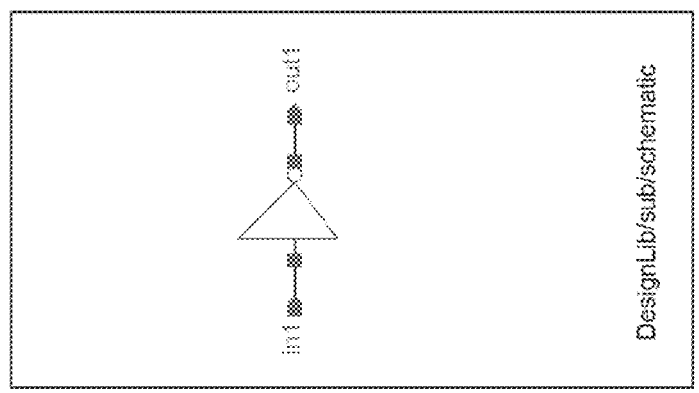
Figure 4C:
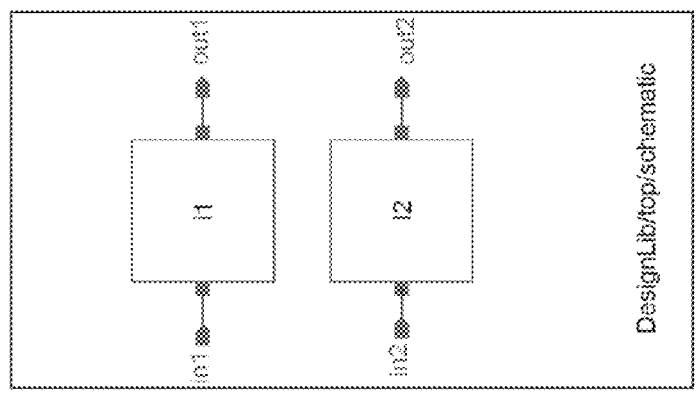

FIGS. 4A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments. FIG. 4A illustrates a simplified view of a TOP cell or module in a hierarchical electronic circuit design. The TOP cell or module comprise two instances of the SUB cell or module, SUB i1 and SUB i2. SUB i1 takes input from in1 and outputs to out1, and SUB i2 takes input from in2 and outputs to out2. Each of SUB i1 and SUB i2 comprises an instance of an inverter—INV i1 for SUB i1 and INV i2 for SUB i2. FIG. 4B illustrates a simplified hierarchical representation of the TOP cell or module.

FIG. 4C illustrates a reference schematic that is designed in a particular manner. In this example, the TOP cell is assumed to be a digital block. Nonetheless, the process disclosed herein also applies to mixed-signal or analog blocks. Furthermore, the examples uses specific languages and codes, but one of ordinary skill in the art clearly knows that other languages or codes may also be used to achieve similar purpose so the languages or codes are not to be considered as limiting the scope of various embodiments or the claims. Note that the reference schematic as illustrated in FIG. 4C may prevent adding or creating one or more net or terminal sets on higher level instances because the reference schematics as illustrated in FIG. 4C comprise net or terminal sets in the schematic for the INV i1 (or i2) level.

The Verilog description for the digital block may be expressed as follows:

```
module sub ( in1, out1);
input in1;
output out1;
INV i1(in1, out1);
endmodule
module top ( in1, in2, out1, out2);
sub i1 (in1, out1);
sub i2 (in2, out2)
endmodule
```

The power data file may be expressed as follows. Note that a Common Power Format file is used in this example, but one of ordinary skill in the art clearly knows that other formats of files, such as an UPF file, may also be used to achieve similar purposes.

```
set_design top
create_power_nets -nets { VDD1 VDD2}
create_ground_nets -nets {VSS1 VSS2}
create_power_domain -name PD1 -default -instances i1
create_power_domain -name PD2 -instances i2
update_power_domain -name PD1 -primary_power_net VDD1 -
    primary_ground_net VSS1
update_power_domain -name PD2 -primary_power_net VDD2 -
    primary_ground_net VSS2
create_global_connection -domain PD1 -net VSS1 -pin VSS!
create_global_connection -domain PD1 -net VDD1 -pin VDD!
create_global_connection -domain PD2 -net VSS2 -pin VSS!
create_global_connection -domain PD2 -net VDD2 -pin VDD!
end_design
```

Note that two power domains, PD1 and PD2, are created in the above example.

FIG. 4C(a) illustrates the symbol of an inverter. In this case, the inverter symbol is stored as a reference library for the inverter. FIG. 4C(b) illustrates a schematic of the inverter which is stored as a reference library for the inverter. Note that the method or the system identifies, defines, or redefines the net/terminal set (in this example, netSet) to be pwr=vddD and gnd=vssD in FIG. 4C(b). It shall be noted that these approaches encourage a reference cell developer to use net or terminal set overrides while providing the freedom to a reference cell developer or designer to redefine the default set of a net or terminal expression and also the freedom to a user or an integrator to override such a default set. FIG. 4C(c) illustrates the annotations of net/terminal set (in this case a netSet) in the power and ground tap of the schematic. The netSet, vdd [@pwr:%:vdd!] or simply vdd, specifies that the power is defaulted to vdd!, and the netExpr, vss [@gnd:%:vss!], specifies that the ground is defaulted to vss!. It shall be noted that the square bracket "[@signs:%:sign]", which is always present in a net/terminal expression, is not always present in a net or terminal set. In some embodiments, such square brackets are present in a net or terminal set only when such a net or terminal set is creating an override re-parameterization and specifying a new property name/default net for the inherited connections search.

FIG. 4C(d) illustrates the process that the method or the system annotates the top cell. FIG. 4C(e) illustrates the schematic of the SUB cell or module in the block. It can be seen that the SUB cell or module receives no modification or annotation. FIG. 4C(f) illustrates the schematic of the inverter in the reference library, which is usually considered golden and thus does not allow modification.) FIG. 4C(f) shows that the inverter schematic is annotated by the net/terminal set (in this example, netSet), pwr=vddD and gnd=vssD. Nonetheless, as presented in the preceding paragraph(s) for FIG. 4C, the reference schematics in FIG. 4C are designed differently from, for example, the reference schematics in FIG. 5C such that the method or the system may create the net or terminal sets at the TOP level schematic for the FIG. 5C reference schematics, whereas the net or terminal sets are created at a lower (INV) level for the reference schematics in FIG. 4C.

FIG. 4C(g) illustrates that the method or the system automatically generates, from reading the CPF file, the netExpr, vdd [@pwr:%:vdd!] and vss [@gnd:%:vss!], in the power and ground tap of the schematics. It shall be noted that the CPF read may not be able to handle this case if the reference cells (e.g., the inverter) are considered as golden and do not allow modification such as annotations. Another approach to resolve this class of circuit blocks is illustrated in FIGS. 5A-C with detailed description fully set forth below.

FIGS. 5A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments. FIG. 5A illustrates a simplified view of a TOP cell or module in a hierarchical electronic circuit design. The TOP cell or module comprise two instances of the SUB cell or module, SUB i1 and SUB i2. SUB i1 takes input from in1 and outputs to out1, and SUB i2 takes input from in2 and outputs to out2. Each of SUB i1 and SUB i2 comprises an instance of an inverter—INV i1 for SUB i1 and INV i2 for SUB i2. FIG. 5B illustrates a simplified hierarchical representation of the TOP cell or module.

FIG. 5C illustrates an example of the method or the system for implementing multi-power domain digital or mixed-signal verification and low power simulation in some embodiments. Note that the exemplary schematics as shown in FIG. 5C are designed differently. Unlike the reference schematics in FIG. 4C, the reference schematics in FIG. 5C specify the net or terminal expressions on the INV level, and thus make the specification of the net or terminal sets at the TOP level possible. In this example, the TOP cell is assumed to be a digital block. Nonetheless, the process disclosed herein also applies to mixed-signal or analog blocks. Furthermore, the examples uses specific languages and codes, but one of ordinary skill in the art clearly knows that other languages or codes may also be used to achieve similar purpose so the languages or codes are not to be considered as limiting the scope of various embodiments or the claims.

The Verilog description for the digital block may be expressed as follows:

```
module sub ( in1, out1);
input in1;
output out1;
INV i1(in1, out1);
endmodule
module top ( in1, in2, out1, out2);
sub I1 (in1, out1);
sub i2 (in2, out2)
endmodule
```

The power data file may be expressed as follows. Note that a Common Power Format file is used in this example, but one of ordinary skill in the art clearly knows that other formats of files, such as an UPF file, may also be used to achieve similar purposes.

```
set_design top
create_power_nets -nets { VDD1 VDD2}
create_ground_nets -nets {VSS1 VSS2}
create_power_domain -name PD1 -default -instances i1
create_power_domain -name PD2 -instances i2
update_power_domain -name PD1 -primary_power_net VDD1 -
    primary_ground_net VSS1
update_power_domain -name PD2 -primary_power_net VDD2 -
    primary_ground_net VSS2
create_global_connection -domain PD1 -net VSS1 -pin VSS!
create_global_connection -domain PD1 -net VDD1 -pin VDD!
create_global_connection -domain PD2 -net VSS2 -pin VSS!
create_global_connection -domain PD2 -net VDD2 -pin VDD!
end_design
```

Note that two power domains, PD1 and PD2, are created in the above example.

FIG. 5C(a) illustrates the symbol of an inverter. In this case, the inverter symbol is stored as a reference library for the inverter. FIG. 5C(b) illustrates a schematic of the inverter which is stored as a reference library for the inverter. Note that the method or the system obtains pwr=[@pwr_ovr:%:vdd!] and gnd=[@gnd_ovr:%:vss!] in FIG. 5C(b) from the reference schematics. These net or terminal sets obtained from the reference schematics causes the generation of net or terminal sets at a higher hierarchical level (TOP level in this example) such as the net or terminal sets on the TOP level as shown in FIG. 5C(d) below.

FIG. 5C(c) illustrates the annotations of net/terminal expression (in this case a netExpr) in the power and ground tap of the schematic. The netExpr, vdd [@pwr:%:vddD!], specifies that the power is defaulted to vddD!, and the netExpr, vss [@gnd:%:vssD!], specifies that the ground is defaulted to vssD!. FIG. 5C(d) illustrates the process that the method or the system annotates the top cell by defining or redefining the net/terminal set (in this example, the netSet) pwr_ovr=vdd1 and gnd_ovr=vss1 for cell i1 and pwr_ovr=vdd2 and gnd_ovr=vss2 for cell i2 in the top schematic. These annotations provide that the names of the overriding power are to be vdd1 and vdd2 for i1 and i2 respectively, and the names of the overriding ground are to be vss1 and vss2 for i1 and i2 respectively.

FIG. 5C(e) illustrates the schematic of the SUB cell or module in the block. It can be seen that the SUB cell or module receives no modification or annotation. FIG. 5C(f) illustrates the schematic of the inverter in the reference library, which is usually considered golden and thus does not allow modification.) Nonetheless, it can be seen from FIG. 5C(f) that the inverter schematic is annotated by the overriding net/terminal expression (in this example, netSet or an overriding netExpr), pwr=[@pwr_ovr:%:vdd!] and gnd=[@gnd_ovr:%:vss!].

FIG. 5C(g) illustrates that the method or the system automatically generates, from reading the CPF file, the netExpr, vdd [@pwr:%:vdd!] and vss [@gnd:%:vss!], in the power and ground tap of the schematics. In this example as illustrated in FIGS. 5A-C, the netSet netExpr [pwr_ovr:%:vdd!] defaults to net vdd! because no netSet in the upper hierarchy. The CPF's specification, by "create_global_connection-domain PD1-net VDD1-pin VDD!, specifies vdd! as the target CPF pin. Furthermore, the CPF import/read automatically creates netSet "pwr_ovr=vdd1" on instance i1. The same also applies to instance i2. That is, by annotating the reference cell library (in this case, the inverter schematic), the schematic may comprise i1 and i2 which belong to different power domains (PD1 and PD2 respectively.)

Figure 6A:
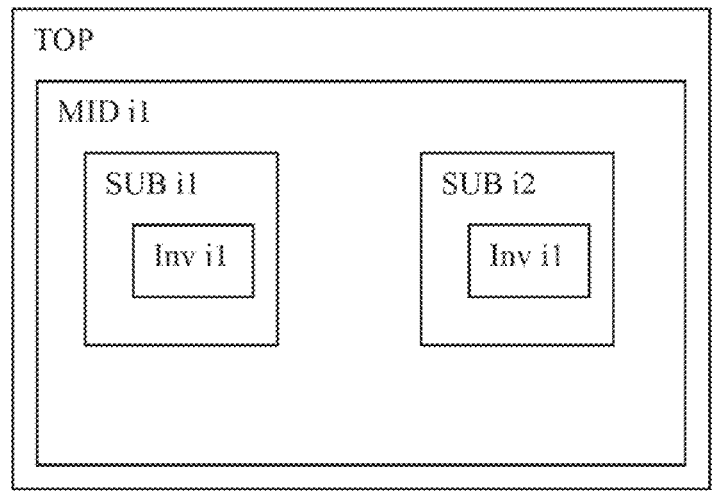
FIG. 6A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments where the hierarchical electronic circuit design comprises more hierarchical levels than the example as illustrated in FIGS. 5A-C.
Figure 6B:
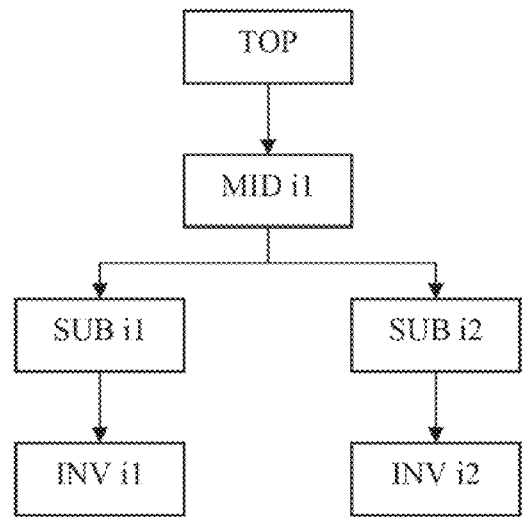
Figure 6C:
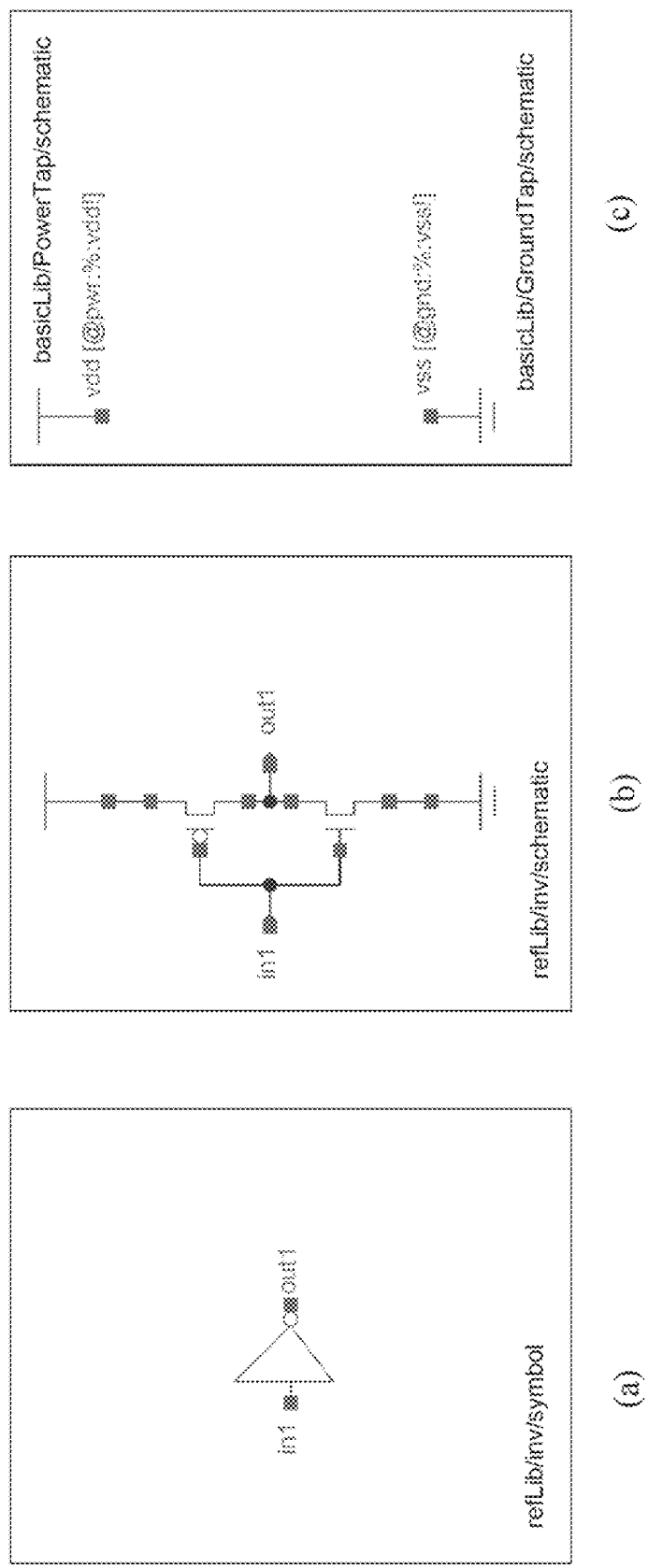
Figure 6C:
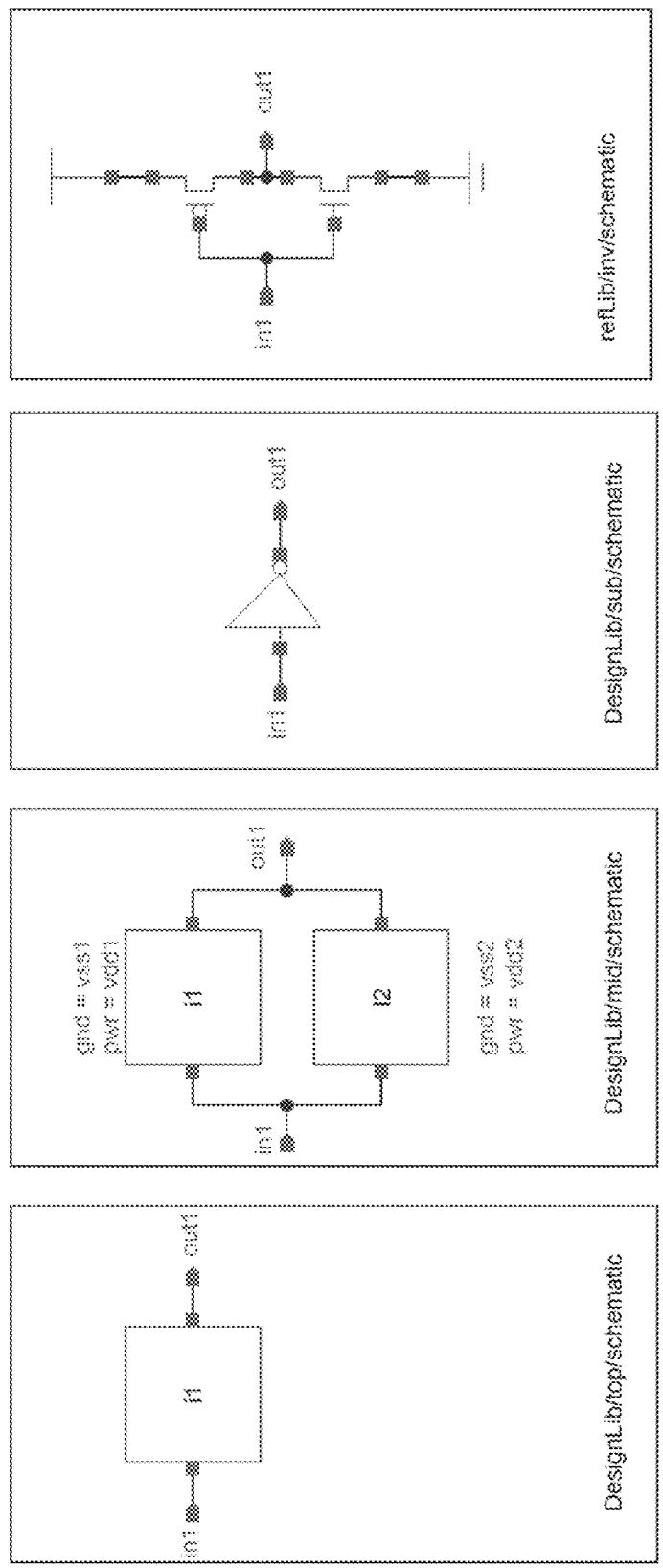

FIGS. 6A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments where the hierarchical electronic circuit design comprises more hierarchical levels than the example as illustrated in FIGS. 5A-C.

FIG. 6A illustrates a simplified view of a TOP cell or module in a hierarchical electronic circuit design. The TOP cell or module comprise a single instance of the MID cell or module, MID i1. The MID i1 comprises, at the next hierarchy, two instances of the SUB cell or module, SUB i1 and SUB i2. SUB i1 takes input from in1 and outputs to out1, and SUB i2 takes input from in2 and outputs to out2. Each of SUB i1 and SUB i2 comprises an instance of an inverter—INV i1 for SUB i1 and INV i2 for SUB i2. FIG. 6B illustrates a simplified hierarchical representation of the TOP cell or module.

FIG. 6C illustrates an example of the method or the system for implementing multi-power domain digital or mixed-signal verification and low power simulation in some embodiments. In this example, the TOP cell is assumed to be a digital block. Nonetheless, the process disclosed herein also applies to mixed-signal or analog blocks. Furthermore, the examples uses specific languages and codes, but one of ordinary skill in the art clearly knows that other languages or codes may also be used to achieve similar purpose so the languages or codes are not to be considered as limiting the scope of various embodiments or the claims.

The Verilog description for the digital block may be expressed as follows:

```
Module sub (in1, out1);
INV i1(in1, out1);
endmodule
module mid ( in1, out1);
input in1;
output out1;
sub i1(in1, out1);
sub i2(in1, out1)
endmodule
module top ( in1, in2);
mid i1 (in1, out1);
endmodule
```

The power data file may be expressed as follows. Note that a Common Power Format file is used in this example, but one of ordinary skill in the art clearly knows that other formats of files, such as an UPF file, may also be used to achieve similar purposes.

```
set_design top
create_power_nets -nets { VDD1 VDD2}
create_ground_nets -nets {VSS1 VSS2}
create_power_domain -name PD1 -default -instances i1.i1
create_power_domain -name PD2 -instances i1.i2
update_power_domain -name PD1 -primary_power_net VDD1 -
    primary_ground_net VSS1
update_power_domain -name PD2 -primary_power_net VDD2 -
    primary_ground_net VSS2
create_global_connection -domain PD1 -net VSS1 -pin VSS!
create_global_connection -domain PD1 -net VDD1 -pin VDD!
create_global_connection -domain PD2 -net VSS2 -pin VSS!
create_global_connection -domain PD2 -net VDD2 -pin VDD!
end_design
```

Note that two power domains, PD1 and PD2, are created in the above example.

FIG. 6C(a) illustrates the symbol of an inverter. In this case, the inverter symbol is stored as a reference library for the inverter. FIG. 6C(b) illustrates a schematic of the inverter which is stored as a reference library for the inverter. Note that the method or the system does not define or redefine the net/terminal set or net/terminal expression in FIG. 6C(b).

FIG. 6C(c) illustrates the annotations of net/terminal expression (in this case a netExpr) in the power and ground tap of the schematic. The netExpr, vdd [@pwr:%:vdd!], specifies that the power is defaulted to vdd!, and the netExpr, vss [@gnd:%:vss!], specifies that the ground is defaulted to vss!. FIG. 6C(d) illustrates that the method or the system does not annotate the top cell.

FIG. 6C(e) illustrates the schematic of the SUB cell or module in the block. It can be seen that the method or the system defines or redefines the net/terminal set (in this example netSet) pwr=vdd1 and gnd=vss1 for instance i1 and pwr=vdd2 and gnd=vss2 for instance i2 in the schematic of the MID cell or module. FIG. 6C(f) illustrates the schematic of the SUB cell or module which does not receive definition or redefinition of net/terminal expressions or net/terminal set.

FIG. 6C(g) illustrates the schematics of the inverter as a reference library which does not receive definition or redefinition of net/terminal expressions or net/terminal set. In this example, the overriding net/terminal set (pwr=vdd1 and gnd=vss1 for instance i1 and pwr=vdd2 and gnd=vss2 for instance i2) is defined at the MID cell which belongs to the second hierarchy level from the top. Unlike the previous example as illustrated in FIGS. 5A-C, the example as illustrated in FIGS. 6A-C comprises at least one additional hierarchical level between the two instances of the inverter, INV i1 and INV i2, and the highest level (for the block of interest) to which the TOP cell or module belongs.

In some embodiments where annotation of the schematic of a reference cell library is permitted, the method or the system may define or redefine the net/terminal set (in these embodiments, netSet) to be pwr_ovr=vdd1 and gnd_ovr=vss1 for instance i1 and pwr_ovr=vdd2 and gnd_ovr=vss2 for instance i2 in the schematic of the MID cell or module in FIG. 6C(e) and the overriding net/terminal expressions (in these embodiments, an overriding netExpr) netExpr pwr=[@pwr_ovr:%:vdd!] and netExpr gnd=[@gnd_ovr:%:vss!] in the schematic of the inverter in FIG. 6C(g).

Figure 7A:
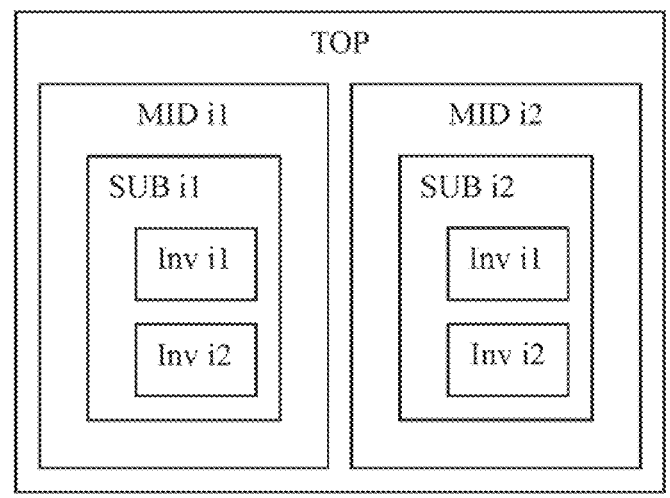
FIG. 7A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments comprising different power domains on different occurrences of the same instance.
Figure 7B:
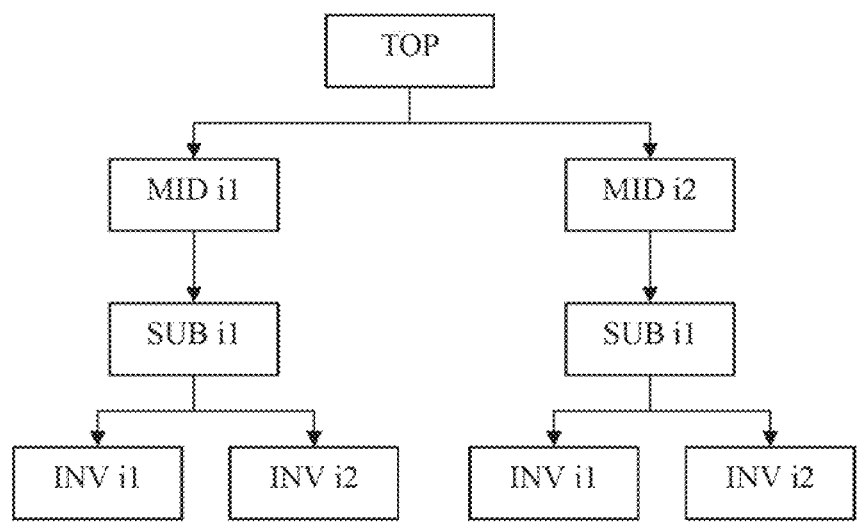
Figure 7C:
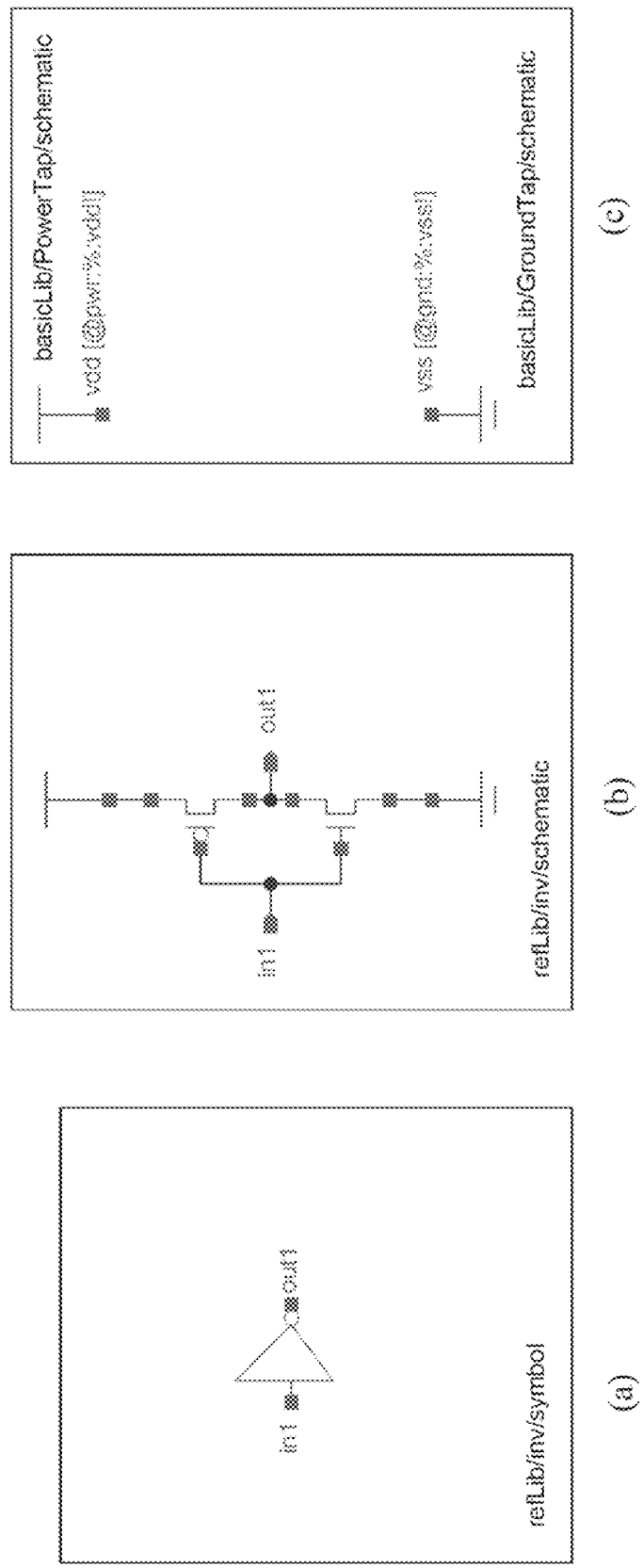
Figure 7C:
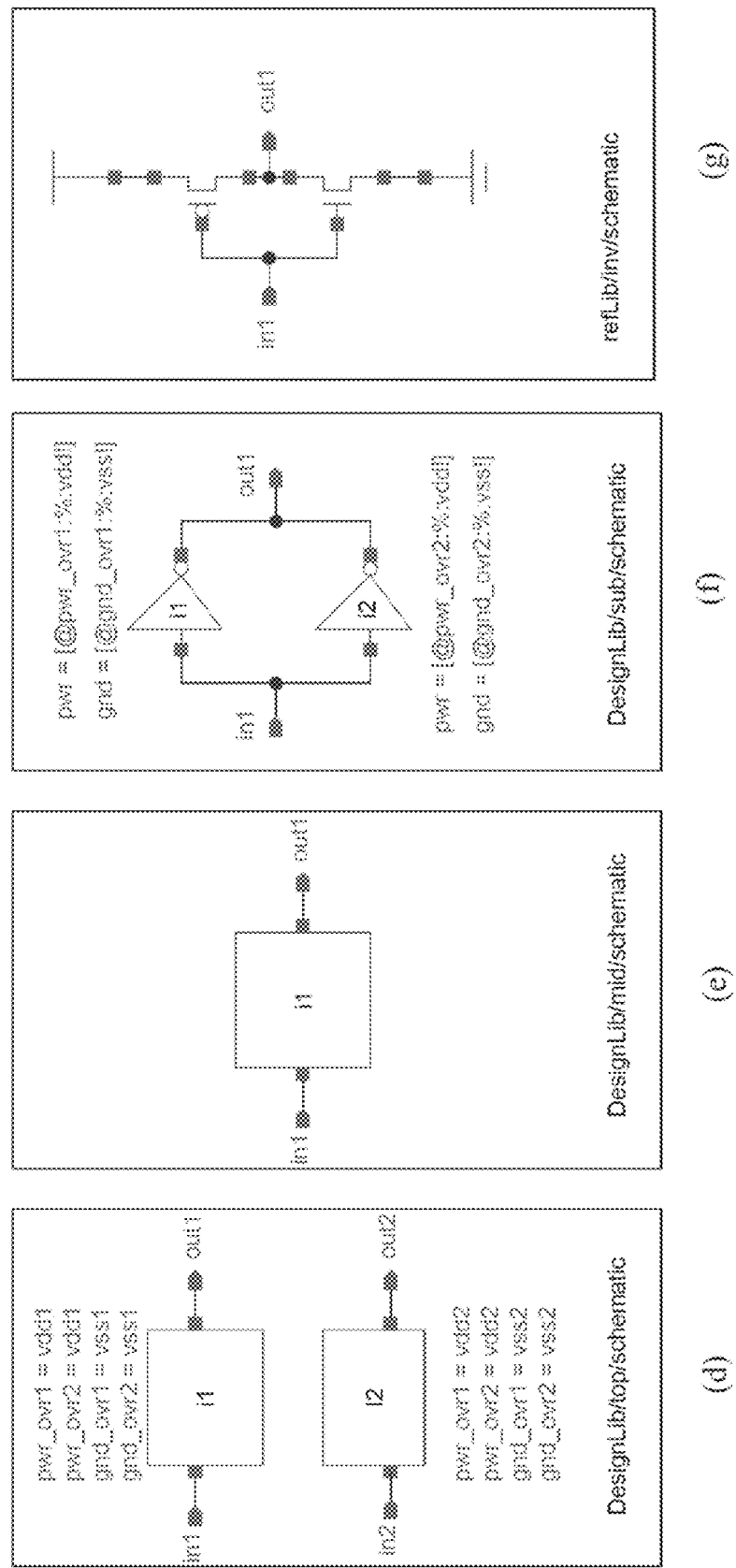

FIGS. 7A-C respectively illustrate the hierarchical digital or mixed-signal block, the hierarchical structure of the functional modules in the digital or mixed-signal block, and the process for generating and mapping the net/terminal sets and net/terminal expressions to schematics of the hierarchical electronic circuit design in another exemplary implementation of some embodiments comprising different power domains on different occurrences of the same instance. FIG. 7A illustrates a simplified view of a TOP cell or module in a hierarchical electronic circuit design. The TOP cell or module comprises two instances of the MID cell or module, MID i1 and MID i2. The MID i1 comprises, at the next hierarchy, a single instance of the SUB cell or module, SUB i1, and the MID i2 comprises a single instance of the SUB cell or module, SUB i2. SUB i1 takes input from in1 and outputs to out1, and SUB i2 takes input from in2 and outputs to out2. Each of SUB i1 and SUB i2 comprises two instances of an inverter—INV i1 and Inv I2. FIG. 7B illustrates a simplified hierarchical representation of the TOP cell or module.

FIG. 7C illustrates an example of the method or the system for implementing multi-power domain digital or mixed-signal verification and low power simulation in some embodiments. In this example, the TOP cell is assumed to be a digital block. Nonetheless, the process disclosed herein also applies to mixed-signal or analog blocks. Furthermore, the examples uses specific languages and codes, but one of ordinary skill in the art clearly knows that other languages or codes may also be used to achieve similar purpose so the languages or codes are not to be considered as limiting the scope of various embodiments or the claims.

The Verilog description for the digital block may be expressed as follows:

```
Module sub (in1, out1);
INV i1(in1, out1);
INV i2(in1, out1);
endmodule
module mid ( in1, out1);
input in1;
output out1;
sub i1(in1, out1);
endmodule
module top ( in1, in2, out1, out2);
mid i1(in1, out1);
mid i2(in2 out2);
endmodule
```

The power data file may be expressed as follows. Note that a Common Power Format file is used in this example, but one of ordinary skill in the art clearly knows that other formats of files, such as an UPF file, may also be used to achieve similar purposes.

```
set_design top
create_power_nets -nets { VDD1 VDD2}
create_ground_nets -nets {VSS1 VSS2}
create_power_domain -name PD1 -default -instances i1.i1.i1 i2.i1.i2
create_power_domain -name PD2 -instances i1.i1.i2 i2.i1.i1
update_power_domain -name PD1 -primary_power_net VDD1 -
    primary_ground_net VSS1
update_power_domain -name PD2 -primary_power_net VDD2 -
    primary_ground_net VSS2
create_global_connection -domain PD1 -net VSS1 -pin VSS!
create_global_connection -domain PD1 -net VDD1 -pin VDD!
create_global_connection -domain PD2 -net VSS2 -pin VSS!
create_global_connection -domain PD2 -net VDD2 -pin VDD!
end_design
```

Note that two power domains, PD1 and PD2, are created in the above example.

FIG. 7C(a) illustrates the symbol of an inverter. In this case, the inverter symbol is stored as a reference library for the inverter. FIG. 7C(b) illustrates a schematic of the inverter which is stored as a reference library for the inverter. Note that the method or the system does not define or redefine the net/terminal set or net/terminal expression in FIG. 7C(b).

FIG. 7C(c) illustrates the annotations of net/terminal expression (in this case a netExpr) in the power and ground tap of the schematic. The netExpr, vdd [@pwr:%:vdd!], specifies that the power is defaulted to vdd!, and the netExpr, vss [@gnd:%:vss!], specifies that the ground is defaulted to vss!.

FIG. 7C(d) illustrates that the method or the system annotate the schematics of the top cell with some net/terminal sets (in this example, netSet). Because the TOP cell or module comprises two instances of the MID cell or module, MID i1 and MID i2, the method or the system automatically generates the net/terminal sets (in this example, netSet) from reading, importing, or interpreting the CPF file and annotates the schematic of the TOP cell or module by defining or redefining pwr_ovr1=vdd1, pwr_ovr2=vdd1, gnd_ovr1=vss1, and gnd_ovr2=vss1 for instance i1, and pwr_ovr1=vdd2, pwr_ovr2=vdd2, gnd_ovr1=vss2, and gnd_ovr2=vss2 for instance i2 in the top level of the hierarchy (of the block of interest) to which the TOP cell or module belongs.

FIG. 7C(e) illustrates the schematic of the SUB cell or module in the block. It can be seen that the method or the system does not defines or redefines any net/terminal expressions or sets or overriding net/terminal expressions for the schematic of the MID cell or module.

FIG. 7C(f) illustrates the schematics of the SUB module which comprises two instances of the inverter, INV i1 and INV i2. Note that the method or the system automatically generates the net/terminal sets (in this example, netSet) from reading, importing, or interpreting the CPF file and annotates the schematic of the schematic of the SUB module by defining or redefining the net/terminal expression (in this example, netExpr) to be netExpr pwr=[@pwr_ovr1:%:vdd!] and netExpr gnd=[@gnd_ovr1:%vss!] for instance INV i1 and netExpr pwr=[@pwr_ovr2:%:vdd!] and netExpr gnd=[@gnd_ovr2:%vss!] for instance INV i2 in the schematic of the SUB cell or module.

FIG. 7C(g) illustrates the schematics of the inverter as a reference library which does not receive definition or redefinition of net/terminal expressions or net/terminal set. In this example as illustrated in FIGS. 7A-C, the reference cell library (the inverter in this example) is not modified or annotated by the method or the system. Therefore, this approach applies whether or not the reference cell libraries can be modified.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

System Architecture Overview

Figure 8:
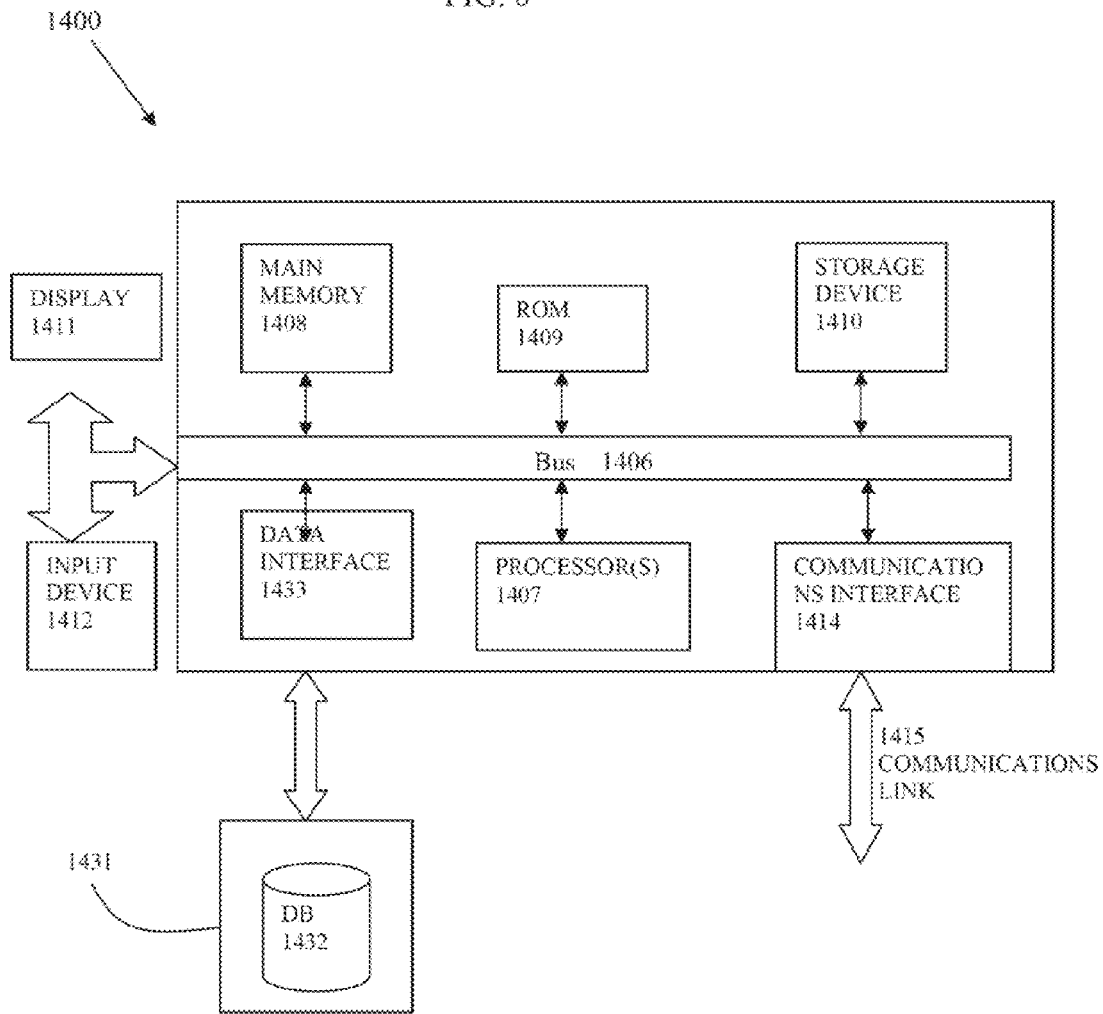
FIG. 8 illustrates a block diagram of an illustrative computing system suitable for implementing various embodiments of the invention as set forth in the application.

FIG. 8 illustrates a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by one or more processor or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions as described in the preceding paragraphs may be performed by using one or more processors, one or more processor cores, or combination thereof 1407. For example, the act of specifying various net or terminal sets or the act or module of performing verification or simulation, etc. may be performed by one or more processors, one or more processor cores, or combination thereof.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing multi-power domain digital or mixed-signal verification and low power simulation of a hierarchical electronic circuit design, comprising:
    using a computer system which comprises at least one processor and is programmed for performing a process, the process comprising:
    identifying a first hierarchical level and a second hierarchical level in the hierarchical electronic circuit design;
    referencing a power data file, which includes power specific data for at least a portion of a transistor level netlist in a digital or mixed-signal block of the hierarchical electronic circuit design, to obtain a first connectivity information;
    determining or identifying power intent data or information, which includes data or information for power intent for the at least the portion of the transistor level netlist, in a schematic of the hierarchical electronic circuit design based at least in part upon one or more criteria to infer a second connectivity information for at least a part of the schematic; and
    performing schematic level verification or simulation by using at least the schematic modified by using at least some of the power intent data or information and the second connectivity information, instead of the transistor level netlist.

2. The computer implemented method of claim 1, wherein the hierarchical electronic circuit design comprises at least one circuit component which belongs to multiple power domains in the first or the second hierarchical level.

3. The computer implemented method of claim 1, wherein the power data file is in a common power format or a unified power format.

4. The computer implemented method of claim 1, wherein the power intent data or information comprises connectivity information.

5. The computer implemented method of claim 1, wherein the act of referencing the power data file comprises:
    creating nets or the multiple power domains; and
    associating respective instances, ports, or pins with the nets or the multiple power domains.

6. The computer implemented method of claim 5, wherein the act of referencing the power data file comprises:
    specifying implementation of the multiple power domains.

7. The computer implemented method of claim 6, wherein the act of referencing the power data file comprises:
    specifying or causing to specify the connectivity information between one or more pins and a global net.

8. The computer implemented method of claim 1, wherein the act of determining or identifying power intent data or information comprises:
    specifying or causing to specify a net or terminal expression in a power or ground tap schematic.

9. The computer implemented method of claim 1, wherein the act of determining or identifying power intent data or information comprises:
    specifying or causing to specify a net or terminal set at the first hierarchical level.

10. The computer implemented method of claim 9, wherein the act of determining or identifying power intent data or information comprises:
    specifying or causing to specify an overriding net or terminal expression at the second hierarchical level.

11. The computer implemented method of claim 10, wherein the second level of hierarchical represents a lowest level that comprises the at least one circuit component in the hierarchical electronic circuit design.

12. The computer implemented method of claim 9, wherein the second level of hierarchy represents one hierarchy level higher than a lowest level that comprises the at least one circuit component in the hierarchical electronic circuit design.

13. The computer implemented method of claim 9, wherein no net or terminal expression is specified in other hierarchical levels of a cell comprising the at least one circuit component.

14. The computer implemented method of claim 2, further comprising:
    specifying or causing to specify a net or terminal expression.

15. The computer implemented method of claim 14, wherein the net or terminal expression is specified at a lowest hierarchical level comprising the at least one circuit component.

16. The computer implemented method of claim 15, wherein the net or terminal expression is specified at two or more hierarchical levels above a lowest hierarchical level comprising the at least one circuit component.

17. The computer implemented method of claim 1, wherein the one or more criteria comprise a hierarchical configuration of the hierarchical electronic circuit design.

18. The computer implemented method of claim 17, wherein the hierarchical configuration comprises determining a number of levels between a lowest hierarchical level comprising the at least one circuit component and a second lowest level at which a net or terminal set may be specified for one or more power terminals and one or more ground terminals.

19. A system for implementing multi-power domain digital or mixed-signal verification and low power simulation of an electronic circuit design, comprising:
    a computer system which comprises at least one processor that is to:
    identify a first hierarchical level and a second hierarchical level in the hierarchical electronic circuit design;
    reference a power data file, which includes power specific data for at least a portion of a transistor level netlist in a digital or mixed-signal block of the hierarchical electronic circuit design, to obtain a first connectivity information;
    determine or identify power intent data or information, which includes data or information for power intent for the at least the portion of the transistor level netlist, in a schematic of the hierarchical electronic circuit design based at least in part upon one or more criteria to infer a second connectivity information for at least a part of the schematic; and perform schematic level verification or simulation by using at least the schematic modified by using at least some of the power intent data or information and the second connectivity information, instead of the transistor level netlist.

20. The system of claim 19, wherein the at least one processor that is to reference the power data file is further to:
create nets or the multiple power domains; and
associate respective instances, ports, or pins with the nets or the multiple power domains.

21. The system of claim 20, wherein the at least one processor that is to reference the power data file is further to:
specify implementation of the multiple power domains, wherein the act of referencing the power data file comprises:
specify or cause to specify the connectivity information between one or more pins and a global net.

22. A computer program product comprising a non-transitory computer readable storage medium having a sequence of instructions stored thereupon which, when executed by a computer system, causes the computer system to perform a method for implementing multi-power domain digital or mixed-signal verification and low power simulation of an electronic circuit design, the method comprising:
using the computer system which comprises at least one processor and is programmed for performing a process, the process comprising:
identifying a first hierarchical level and a second hierarchical level in the hierarchical electronic circuit design;
referencing a power data file, which includes power specific data for at least a portion of a transistor level netlist in a digital or mixed-signal block of the hierarchical electronic circuit design, to obtain a first connectivity information;
determining or identifying power intent data or information, which includes data or information for power intent for the at least the portion of the transistor level netlist, in a schematic of the hierarchical electronic circuit design based at least in part upon one or more criteria to infer a second connectivity information for at least a part of the schematic; and
performing schematic level verification or simulation by using at least the schematic modified by using at least some of the power intent data or information and the second connectivity information, instead of the transistor level netlist.

23. The system of claim 22, wherein the at least one processor that is to determine or identify power intent data or information is further to:
specify or cause to specify a net or terminal set at the first hierarchical level; or
specify or cause to specify a net or terminal expression in a power or ground tap schematic.

24. The computer program product of claim 22, wherein the act of referencing the power data file comprises:
creating nets or the multiple power domains; and
associating respective instances, ports, or pins with the nets or the multiple power domains.

25. The computer program product of claim 24, wherein the act of referencing the power data file comprises:
specifying implementation of the multiple power domains, wherein the act of referencing the power data file comprises:
specifying or causing to specify the connectivity information between one or more pins and a global net.

26. The computer program product of claim 22, wherein the act of determining or identifying power intent data or information comprises at least one of:
specifying or causing to specify a net or terminal set at the first hierarchical level; and
specifying or causing to specify a net or terminal expression in a power or ground tap schematic.

* * * * *